(12) United States Patent
Nakagawa

(10) Patent No.: US 7,287,142 B2
(45) Date of Patent: Oct. 23, 2007

(54) MEMORY DEVICE AND METHOD FOR ARBITRATING INTERNAL AND EXTERNAL ACCESS

(75) Inventor: Yuji Nakagawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 332 days.

(21) Appl. No.: 10/634,758

(22) Filed: Aug. 6, 2003

(65) Prior Publication Data

US 2004/0027882 A1     Feb. 12, 2004

(30) Foreign Application Priority Data

Aug. 8, 2002     (JP) .............................. 2002-231644

(51) Int. Cl.
    *G06F 13/366*     (2006.01)
(52) U.S. Cl. ....................... 711/167; 711/150; 711/151; 711/168
(58) Field of Classification Search ...................... None
    See application file for complete search history.

(56) References Cited

U.S. PATENT DOCUMENTS

| 6,392,958 | B1* | 5/2002 | Lee .......................... 365/233.5 |
| 6,396,758 | B2* | 5/2002 | Ikeda et al. .................. 365/222 |
| 6,545,943 | B2* | 4/2003 | Mizugaki et al. .......... 365/233.5 |
| 6,697,910 | B2* | 2/2004 | Tsukude et al. ............. 711/106 |
| 6,735,679 | B1* | 5/2004 | Herbst et al. ................ 711/167 |
| 2001/0017811 | A1 | 8/2001 | Ikeda et al. .................. 365/222 |
| 2001/0048623 | A1 | 12/2001 | Tanizaki et al. ......... 365/233.5 |
| 2002/0024865 | A1 | 2/2002 | Fujieda et al. |
| 2002/0057607 | A1 | 5/2002 | Mizugaki et al. |

FOREIGN PATENT DOCUMENTS

| GB | 2 265 035 A | 9/1993 |
| JP | 58-026394 A | 2/1983 |
| JP | 9-251783 | 9/1997 |
| JP | 2001-167574 A | 6/2001 |

OTHER PUBLICATIONS

European Search Report, Feb. 17, 2004.

* cited by examiner

*Primary Examiner*—T. Nguyen
(74) *Attorney, Agent, or Firm*—Arent Fox LLP

(57) ABSTRACT

Disclosed is a semiconductor memory device which shortens an external access time when there is contention between an external access and an internal access. The semiconductor memory device includes an arbiter which receives a first entry signal for entering a first access mode (external access) and a second entry signal for entering a second access mode (internal access) and determines priority of the first and second access modes in accordance with an order of receipt of the first and second entry signals. The arbiter sequentially generates a first mode trigger signal corresponding to the first entry signal and a second mode trigger signal corresponding to the second entry signal in accordance with the determined priority. The arbiter executes the first access mode by priority over the second access mode when the arbiter is supplied with the first entry signal with a predetermined period after the second access mode has been determined to have priority.

38 Claims, 19 Drawing Sheets

MEMORY DEVICE AND METHOD FOR ARBITRATING INTERNAL AND EXTERNAL ACCESS

CROSS-REFERENCE TO RELATED APPLICATIONS

This application is based upon and claims the benefit of priority from the prior Japanese Patent Application No. 2002-231644, filed on Aug. 8, 2002, the entire contents of which are incorporated herein by reference.

BACKGROUND OF THE INVENTION

The present invention relates to a semiconductor memory device, a method for controlling a semiconductor memory device and a method for testing a semiconductor memory device. More particularly, this invention relates to a semiconductor memory device which executes an internal access operation and an external access operation.

Recently, semiconductor memory devices (dynamic random access memories (DRAMs)) with a large memory capacity have been used in electronic information devices. A DRAM has a self-refresh capability to refresh cell data of memory cells in accordance with a counter operation in an internal circuit. Because a DRAM with a self-refresh capability does not require an external refresh operation, it has advantages in that its power consumption is reduced and that the circuit design around the DRAM can be simplified.

A DRAM with a self-refresh capability may have contention between an internal refresh request (internal access) for retaining data and an external access request (external access) for writing or reading data. In a case where the internal access has priority, the external access is carried out after the internal access is finished. This case therefore requires about twice the time the access time needed in a case where the external access does not contend with the internal access. Therefore, there are demands for shortening the access time in a case where the external access does not contend with the internal access.

FIG. 1 is a schematic block circuit diagram of a control circuit 61 for a semiconductor memory device (DRAM) 60 which has the conventional self-refresh capability.

The control circuit 61 includes a command detector 62, an internal command generator 63, a refresh decision circuit 64 and a timing generator 65. The internal command generator 63 and the refresh decision circuit 64 constitute a so-called arbiter.

The command detector 62 decodes various commands, such as a write command and a read command, supplied from an external unit, and generates a command detection signal corresponding to the decoded command. In the example shown in FIG. 1, the command detector 62 detects a read command rdb and generates a read-command detection signal rd-cmd.

The refresh decision circuit 64 receives the read-command detection signal rd-cmd and a refresh request signal ref-req from an internal refresh timer (not shown), and determines which operation, the read operation or the refresh operation, has priority in accordance with the signals (rd-cmd and ref-req).

In a case where the refresh request signal ref-req is supplied at an earlier timing than the read-command detection signal rd-cmd, the refresh decision circuit 64 gives priority to the refresh operation. Specifically, the refresh decision circuit 64 generates a refresh start signal ref-start and a refresh state signal ref-state in response to the refresh request signal ref-req.

In a case where the read-command detection signal rd-cmd is supplied at an earlier timing than the refresh request signal ref-req, on the other hand, the refresh decision circuit 64 gives priority to the read operation. Specifically, the refresh decision circuit 64 generates the refresh start signal ref-start and the refresh state signal ref-state after a read state signal rd-state output from the timing generator 65 is reset (after the read operation is completed).

The internal command generator 63 generates a read start signal rd-start in accordance with the read-command detection signal rd-cmd from the command detector 62. At that time, in a case where the refresh operation has priority, the internal command generator 63 generates the read start signal rd-start after the refresh state signal ref-state is reset (after the refresh operation is completed).

In a case where the refresh operation has priority, the timing generator 65 generates a word-line enable timing signal wl-timing for enabling a word line corresponding to a predetermined refresh address in accordance with the refresh start signal ref-start.

In a case where the read operation has priority, on the other hand, the timing generator 65 generates the read state signal rd-state and the word-line enable timing signal wl-timing for enabling a word line in response to the read start signal rd-start. The word line to be enabled corresponds to a predetermined address which is given by an external address signal (not shown).

The operation of the DRAM 60 will be discussed next. FIG. 2 is an operational waveform diagram in a case where priority is given to an external access (read operation in this example) when the external access and an internal access (refresh operation) contend with each other.

Upon detection of the falling of a control signal supplied from an external unit, the command detector 62 decodes the read command rdb and generates the read-command detection signal rd-cmd. The read-command detection signal rd-cmd is supplied to the refresh decision circuit 64 at an earlier timing than the refresh request signal ref-req. At this time, the refresh decision circuit 64 gives priority to the read operation. The timing generator 65 generates the read state signal rd-state and the word-line enable timing signal wl-timing in accordance with the read start signal rd-start from the internal command generator 63. Cell data corresponding to a predetermined address is read out in accordance with the signal wl-timing.

After data reading is completed, the refresh decision circuit 64 generates the refresh start signal ref-start and the refresh state signal ref-state in accordance with the falling of the read state signal rd-state. In accordance with the refresh start signal ref-start, the timing generator 65 generates the word-line enable timing signal wl-timing. In accordance with the signal wl-timing, the refresh operation of a memory cell corresponding to a predetermined refresh address is carried out.

In a case where the external access (read operation) is given priority in the control circuit 61 with the arbiter capability, the refresh operation is executed after the read operation is completed.

FIG. 3 is an operational waveform diagram in a case where priority is given to an internal access when an external access and the internal access contend with each other. FIG. 3 shows a case where an external access time t8 or a time from the supply of the read command rdb to the DRAM 60 to the output of read data DQ from the DRAM 60 is longest (worst case).

Upon detection of the falling of a control signal supplied from an external unit, the command detector 62 decodes the read command rdb and generates the read-command detection signal rd-cmd. The refresh request signal ref-req is supplied to the refresh decision circuit 64 at an earlier timing than the read-command detection signal rd-cmd. At this time, the refresh decision circuit 64 gives priority to the refresh operation and generates the refresh start signal ref-start and the refresh state signal ref-state. The timing generator 65 generates the word-line enable timing signal wl-timing in accordance with the refresh start signal ref-start. The refresh operation of a memory cell corresponding to a predetermined refresh address is carried out in accordance with the signal wl-timing.

After the refresh operation is completed, the internal command generator 63 generates the read start signal rd-start in accordance with the falling of the refresh state signal ref-state. In accordance with the signal rd-start, the timing generator 65 generates the read state signal rd-state and the word-line enable timing signal wl-timing. In accordance with the signal wl-timing, cell data corresponding to a predetermined address is read out.

In a case where the internal access (refresh operation) is given priority in the control circuit 61, the read operation is executed after the refresh operation is completed.

In a case where the refresh operation is given priority (FIG. 3), however, an access delay occurs in the external access because the read operation is executed after the refresh operation is completed. In this case, the external access time t8 becomes the sum of the time needed for the normal read operation and the time needed for the refresh operation. Therefore, the external access time t8 is about twice an external access time t7 in a case where the read operation is given priority (FIG. 2). The increase in external access time is a big factor standing in the way of improving the device speed.

SUMMARY OF THE INVENTION

In one aspect of the present invention, a semiconductor memory device having a first access mode and a second access mode includes an arbiter which receives a first entry signal for entering the first access mode and a second entry signal for entering the second access mode. The arbiter determines priority of the first and second access modes in accordance with an order of receipt of the first and second entry signals, and sequentially generates a first mode trigger signal corresponding to the first entry signal and a second mode trigger signal corresponding to the second entry signal in accordance with the determined priority. A signal generating circuit is connected to the arbiter for generating an internal operation signal in accordance with at least one of the first mode trigger signal and the second mode trigger signal. The arbiter executes the first access mode by priority over the second access mode, when the arbiter is supplied with the first entry signal within a predetermined period after priority for the second access mode has been determined.

In a further aspect of the present invention, a semiconductor memory device having a first access mode and a second access mode includes an arbiter which receives a first entry signal for entering the first access mode and a second entry signal for entering the second access mode. The arbiter determines priority of the first and second access modes in accordance with an order of receipt of the first and second entry signals. In case of receiving the first entry signal before a predetermined time after having received the second entry signal, the arbiter stops executing the second access mode and executes the first access mode.

A further aspect of the present invention is a method for controlling a semiconductor memory device having a first access mode and a second access mode. The method includes determining priority of the first and second access modes in accordance with a first entry signal for entering the first access mode and a second entry signal for entering the second access mode, executing the second access mode when the second access mode is determined to have priority, detecting if the first entry signal has been supplied within a predetermined period after execution of the second access mode has been started, and executing the first access mode by priority over the second access mode when the first entry signal is detected.

A further aspect of the present invention is a method for testing access time in a semiconductor memory device having a first access mode and a second access mode. The method includes supplying a second entry signal for entering the second access mode to the semiconductor memory device and executing the second access mode, supplying a first entry signal for entering the first access mode to the semiconductor memory device after supplying the second entry signal, enabling a predetermined word line in the semiconductor memory device in accordance with the first entry signal in the second access mode, executing the first access mode after the second access mode is finished, and measuring a period from a point at which the first entry signal is supplied to a point at which the first access mode is finished.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
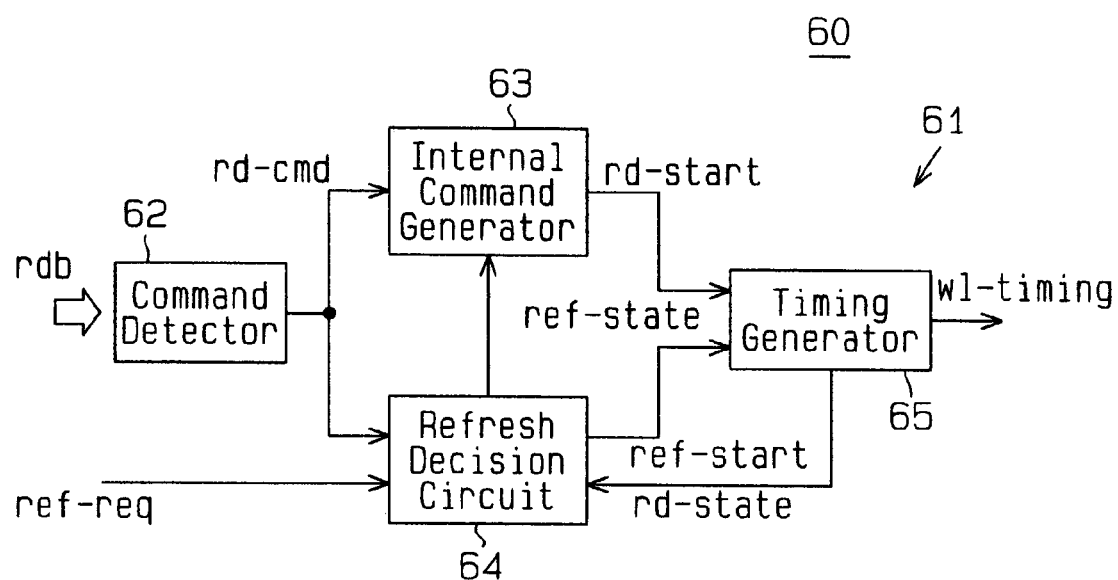
FIG. 1 is a schematic block circuit diagram of a control circuit for a conventional semiconductor memory device.
Figure 2:
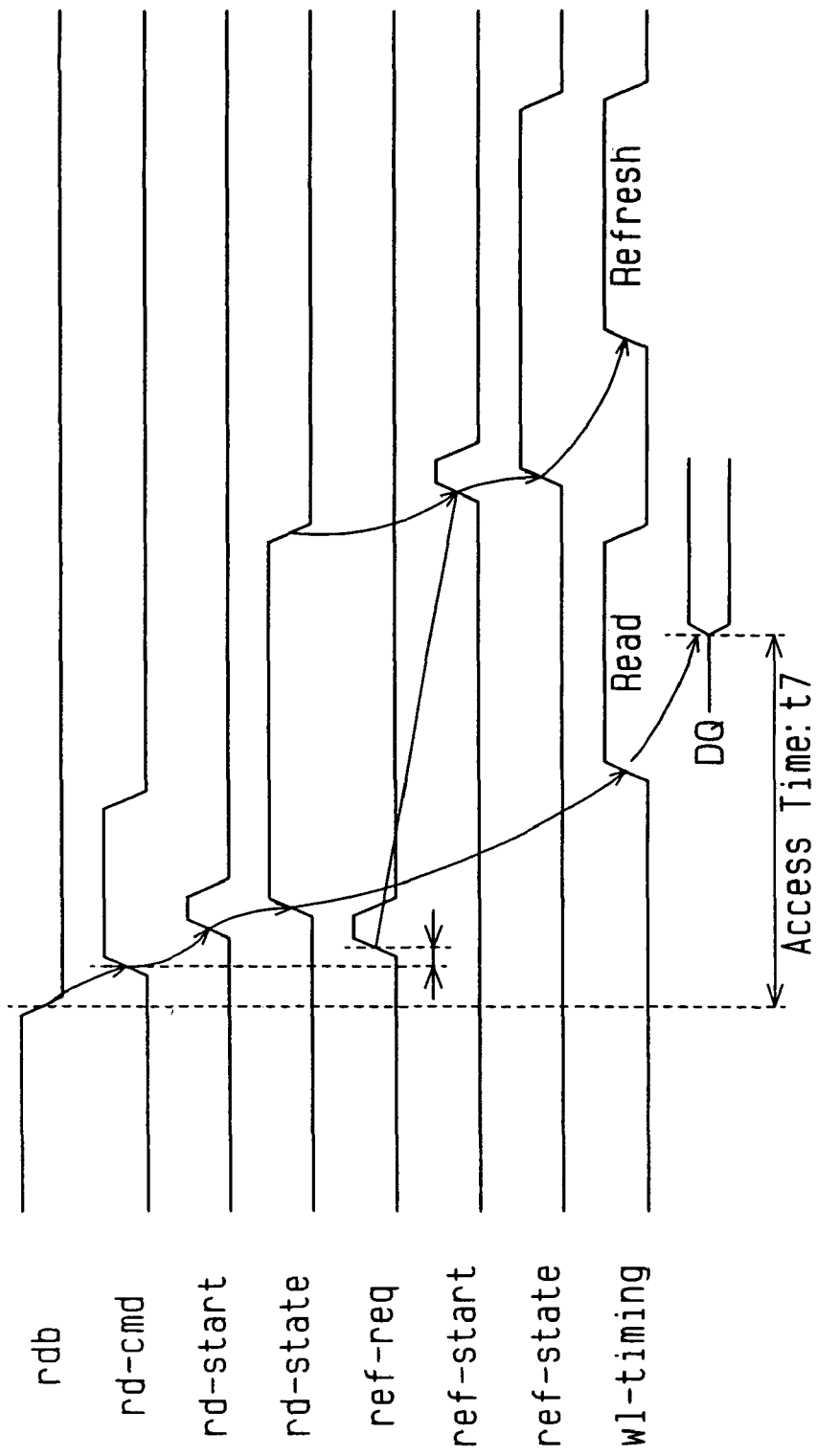
FIGS. 2 and 3 are operational waveform diagrams for the semiconductor memory device in FIG. 1.

In the drawings, like numerals are used for like elements throughout.

Figure 4:
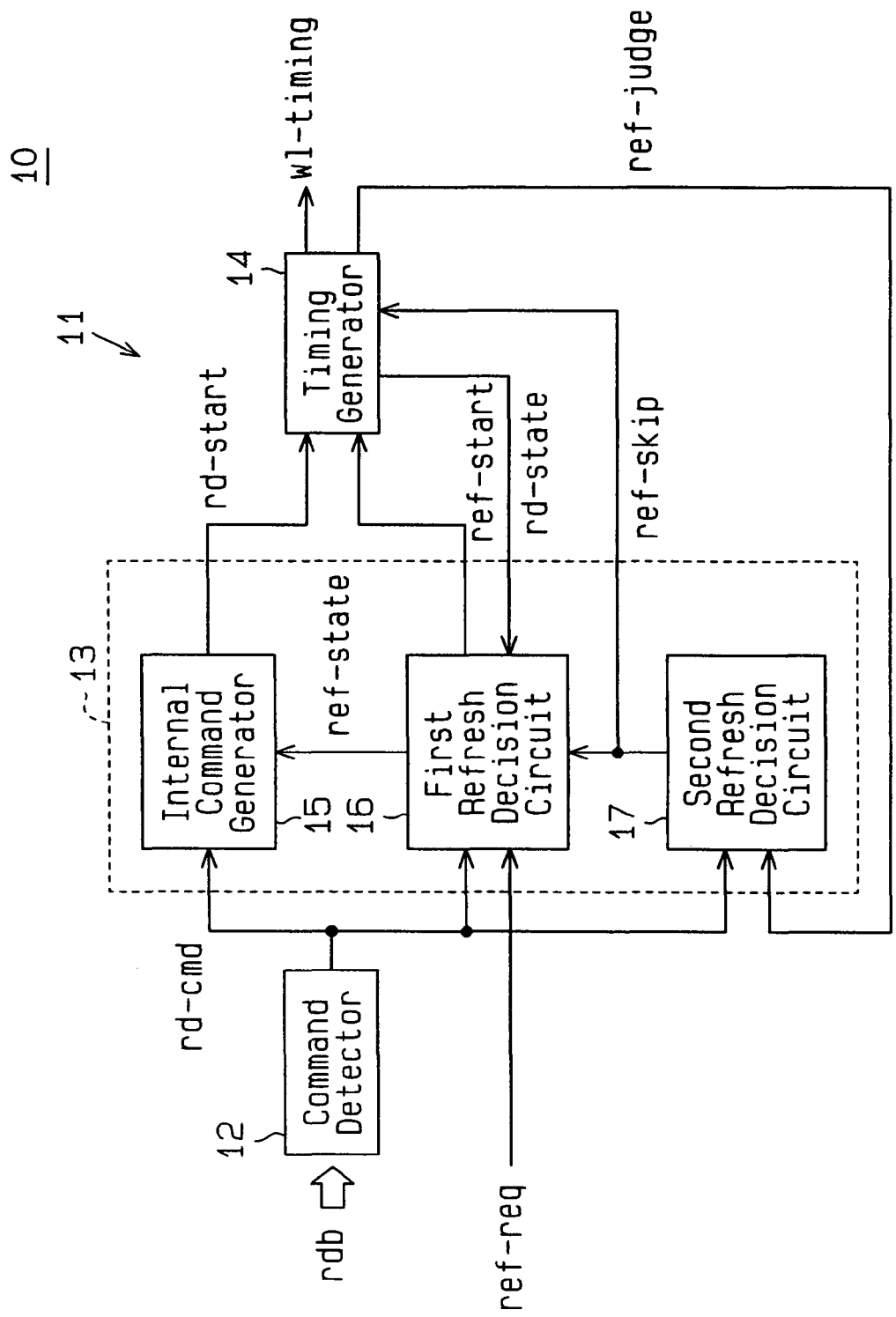
FIG. 4 is a schematic block circuit diagram of a control circuit for a semiconductor memory device according to a first embodiment of the present invention.

FIG. 4 is a schematic block circuit diagram of a control circuit 11 for a semiconductor memory device (DRAM) 10 having a self-refresh capability according to the first embodiment of the present invention.

The control circuit 11 includes a command detector (entry detecting circuit) 12, an arbiter 13 and a timing generator (signal generating circuit) 14. The arbiter 13 includes an internal command generator (mode trigger generating circuit) 15, a first refresh decision circuit (first decision circuit) 16 and a second refresh decision circuit (second decision circuit) 17.

The command detector 12 decodes various commands and generates a command detection signal (first entry signal) corresponding to a decoded command. In the first embodiment, for example, the command detector 12 decodes a read command rdb and generates a read-command detection signal rd-cmd.

The first refresh decision circuit 16 receives the read-command detection signal rd-cmd and a refresh request signal ref-req (second entry signal) generated by an internal refresh timer (not shown). The first refresh decision circuit 16 determines the degrees of priority of a first access mode and a second access mode from the input order of the read-command detection signal rd-cmd and the refresh request signal ref-req. The first access mode is a read operation/write operation (external access) (the read operation in the first embodiment). The second access mode is a refresh operation (internal access).

Specifically, in a case where the refresh request signal ref-req is supplied earlier than the read-command detection signal rd-cmd, the first refresh decision circuit 16 gives priority to the refresh operation. In this case, the first refresh decision circuit 16 generates a refresh start signal ref-start (second mode trigger signal) and a refresh state signal ref-state.

In a case where the read-command detection signal rd-cmd is supplied earlier than the refresh request signal ref-req, on the other hand, the first refresh decision circuit 16 gives priority to the read operation. In this case, the first refresh decision circuit 16 generates the refresh start signal ref-start and the refresh state signal ref-state after a read state signal rd-state generated by the timing generator 14 is reset (after the read operation is completed).

The internal command generator 15 generates a read start signal rd-start (first mode trigger signal) in response to the read-command detection signal rd-cmd. In a case where the refresh operation has priority over the read operation, the internal command generator 15 generates the read start signal rd-start after the refresh state signal ref-state is reset (after the refresh operation is completed).

The second refresh decision circuit 17 finally determines the degrees of priority of the read operation and the refresh operation in accordance with the read-command detection signal rd-cmd and a refresh-judge timing, signal (decision signal) ref-judge.

Specifically, when receiving the read-command detection signal rd-cmd within a predetermined period after the refresh operation is given priority by the first refresh decision circuit 16, the second refresh decision circuit 17 interrupts the refresh operation and gives priority to the read operation. The predetermined period is a period within which a word line corresponding to the address of a memory cell to be subjected to the refresh operation (refresh address) is enabled by a word-line enable timing signal (word-line enable signal) wl-timing which is generated by the timing generator 14. Specifically, the predetermined period ranges from the timing at which the refresh request signal ref-req is enabled prior to enabling of the read-command detection signal rd-cmd to the timing at which the word-line enable timing signal wl-timing associated with refreshing is enabled.

The second refresh decision circuit 17 determines whether the refresh operation is in an operation stage in the predetermined period or not in accordance with the refresh-judge timing signal ref-judge generated by the timing generator 14. Specifically, the second refresh decision circuit 17 generates a refresh-cancel signal ref-skip after the refresh operation is given priority by the first refresh decision circuit 16 and when the read-command detection signal rd-cmd is supplied while the refresh-judge timing signal ref-judge is being supplied. The refresh-cancel signal ref-skip is supplied to the first refresh decision circuit 16 and the timing generator 14.

The first refresh decision circuit 16 resets the refresh state signal ref-state in response to the refresh-cancel signal ref-skip. The internal command generator 15 generates the read start signal rd-start in response to the reset refresh state signal ref-state.

In a case where the refresh operation is selected (given priority) according to the result of the decision made by the first refresh decision circuit 16, the timing generator 14 generates the refresh-judge timing signal ref-judge, then generates the word-line enable timing signal wl-timing for enabling a word line corresponding to a predetermined refresh address.

In a case where the read operation is selected (given priority), on the other hand, the timing generator 14 generates the read state signal rd-state and generates the word-line enable timing signal wl-timing for enabling a word line corresponding to a predetermined address based on an external address signal (not shown).

Figure 5:
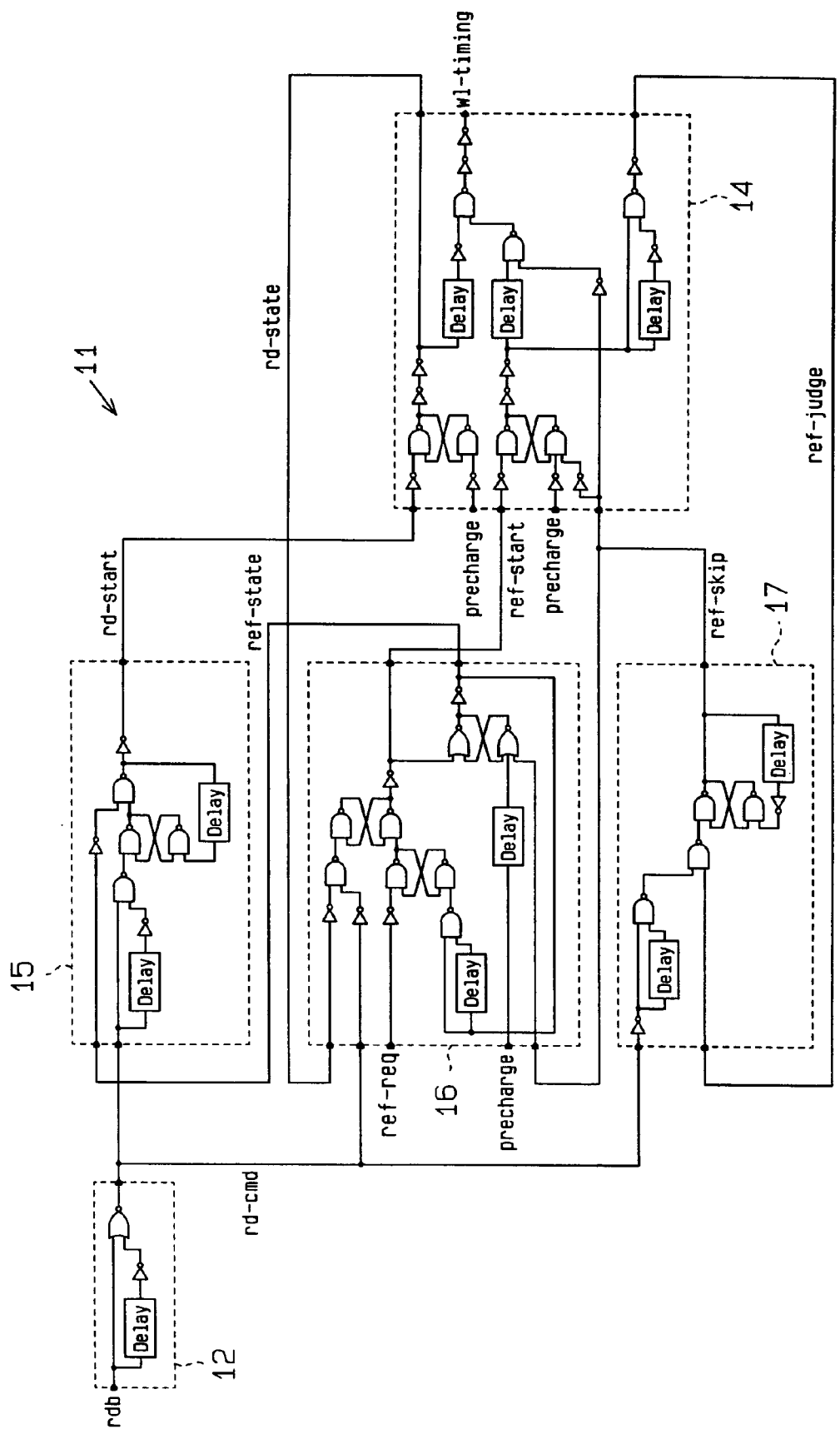
FIG. 5 is a schematic circuit diagram of the control circuit in FIG. 4.

FIG. 5 is a schematic circuit diagram of the control circuit 11 in FIG. 4. The command detector 12 generates the read-command detection signal rd-cmd of a one-shot pulse in response to the falling of the read command rdb.

In response to the rising of the read-command detection signal rd-cmd, the internal command generator 15 generates the read start signal rd-start of a one-shot pulse. In a case where the refresh state signal ref-state is set (H level) at that time, the internal command generator 15 generates the read start signal rd-start after the refresh state signal ref-state is reset (L level).

In response to the rising of the refresh request signal ref-req, the first refresh decision circuit 16 generates the refresh start signal ref-start of a one-shot pulse. In a case where the read state signal rd-state is set at that time, the first refresh decision circuit 16 generates the refresh start signal ref-start after the read state signal rd-state is reset.

The first refresh decision circuit 16 sets the refresh state signal ref-state at the same time as generating the refresh start signal ref-start. The refresh state signal ref-state is reset by a precharge signal precharge or the refresh-cancel signal ref-skip.

The second refresh decision circuit 17 generates the refresh-cancel signal ref-skip upon detection of the input (H level) of the read-command detection signal rd-cmd while the refresh-judge timing signal ref-judge is supplied (H level). The refresh-cancel signal ref-skip is held active (H level) until the refresh operation is stopped (specifically until the refresh state signal ref-state is reset and the generation of the word-line enable timing signal wl-timing is stopped).

In response to the rising of the read start signal rd-start, the timing generator 14 generates the read state signal rd-state and the word-line enable timing signal wl-timing for enabling a word line associated with the read operation. The read state signal rd-state and the word-line enable timing signal wl-timing are reset by the precharge signal precharge after the read operation is finished.

In response to the rising of the refresh start signal ref-start, the timing generator 14 generates the refresh-judge timing signal ref-judge and then generates the word-line enable timing signal wl-timing for enabling a word line associated with refreshing. The refresh-judge timing signal ref-judge is generated in such a way as to be active (H level) immediately before the word-line enable timing signal wl-timing rises.

The timing generator 14 stops generating the word-line enable timing signal wl-timing in a case where the refresh-cancel signal ref-skip is generated or keeps generating the word-line enable timing signal wl-timing in a case where the refresh-cancel signal ref-skip is not generated. The word-line enable timing signal wl-timing is reset by the precharge signal precharge after the refresh operation is finished.

Figure 6:
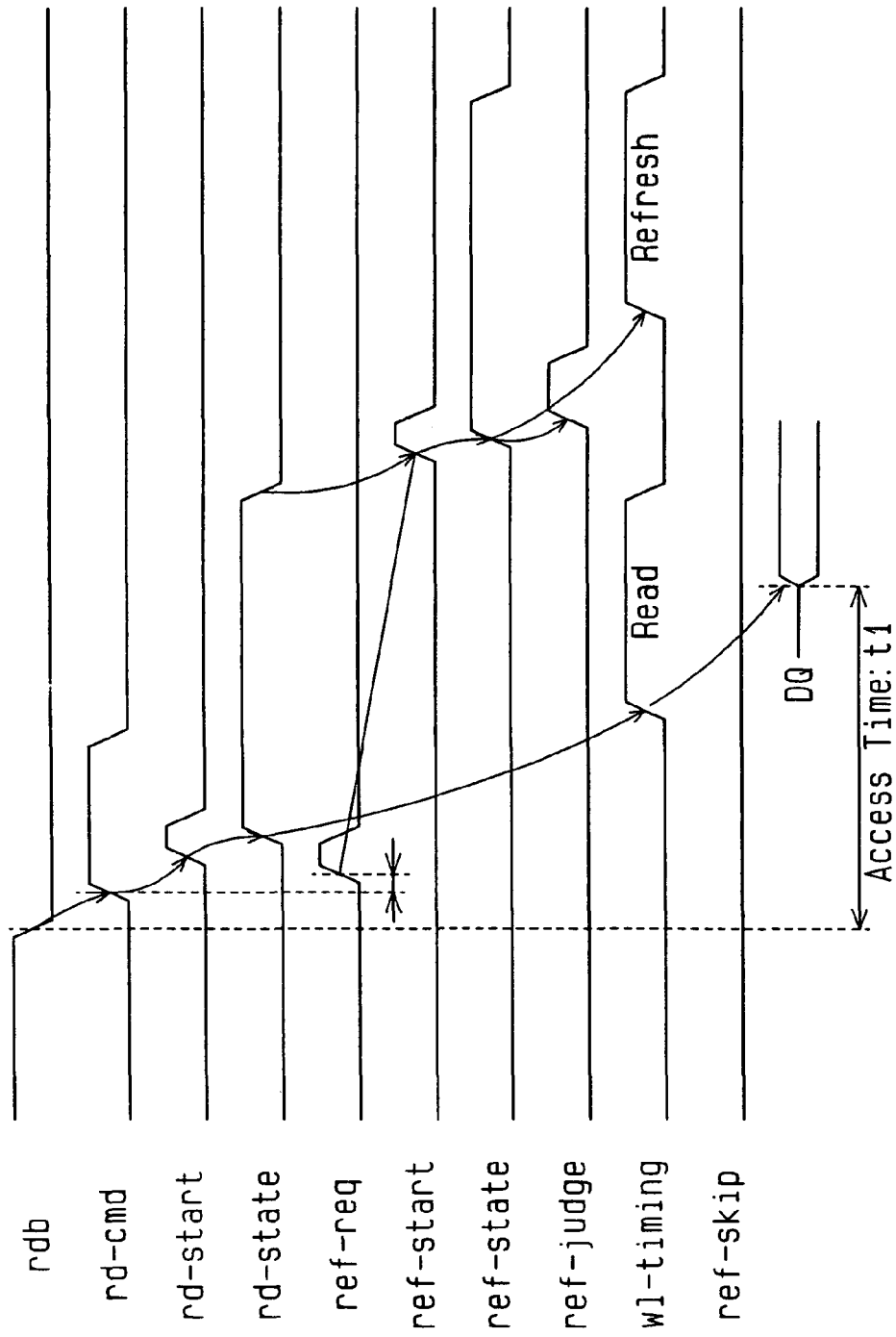
FIGS. 6 to 8 are operational waveform diagrams for the semiconductor memory device in FIG. 4.

The operation of the DRAM 10 including the control circuit 11 will be discussed below. FIG. 6 is an operational waveform diagram in a case where the read-command detection signal rd-cmd is supplied to the first refresh decision circuit 16 earlier than the refresh request signal ref-req when an external access (read operation) and an internal access (refresh operation) contend with each other.

Upon detection of the falling of a control signal supplied from an external unit, the command detector 12 decodes the read command rdb and generates the read-command detection signal rd-cmd. The read-command detection signal rd-cmd is supplied to the first refresh decision circuit 16 earlier than the refresh request signal ref-req.

The first refresh decision circuit 16 gives priority to the read operation and the internal command generator 15 generates the read start signal rd-start in response to the rising of the read-command detection signal rd-cmd. In response to the rising of the read start signal rd-start, the timing generator 14 generates the read state signal rd-state and the word-line enable timing signal wl-timing. A word line associated with the read operation is enabled and cell data is read out.

After data reading is completed, the first refresh decision circuit 16 generates the refresh start signal ref-start and the refresh state signal ref-state in response to the falling of the read state signal rd-state. The timing generator 14 generates the word-line enable timing signal wl-timing in response to the rising of the refresh start signal ref-start. A word line associated with refreshing is enabled and the refresh operation is carried out.

In a case where the read-command detection signal rd-cmd is supplied to the first refresh decision circuit 16 at an earlier timing than the refresh request signal ref-req, the read operation is given priority. That is, the refresh operation is performed after the read operation is completed. In this case, therefore, an external access time t1 (the time from the supply of the read command rdb to the DRAM 10 to the output of read data DQ from the DRAM 10) does not include an access delay.

Figure 7:
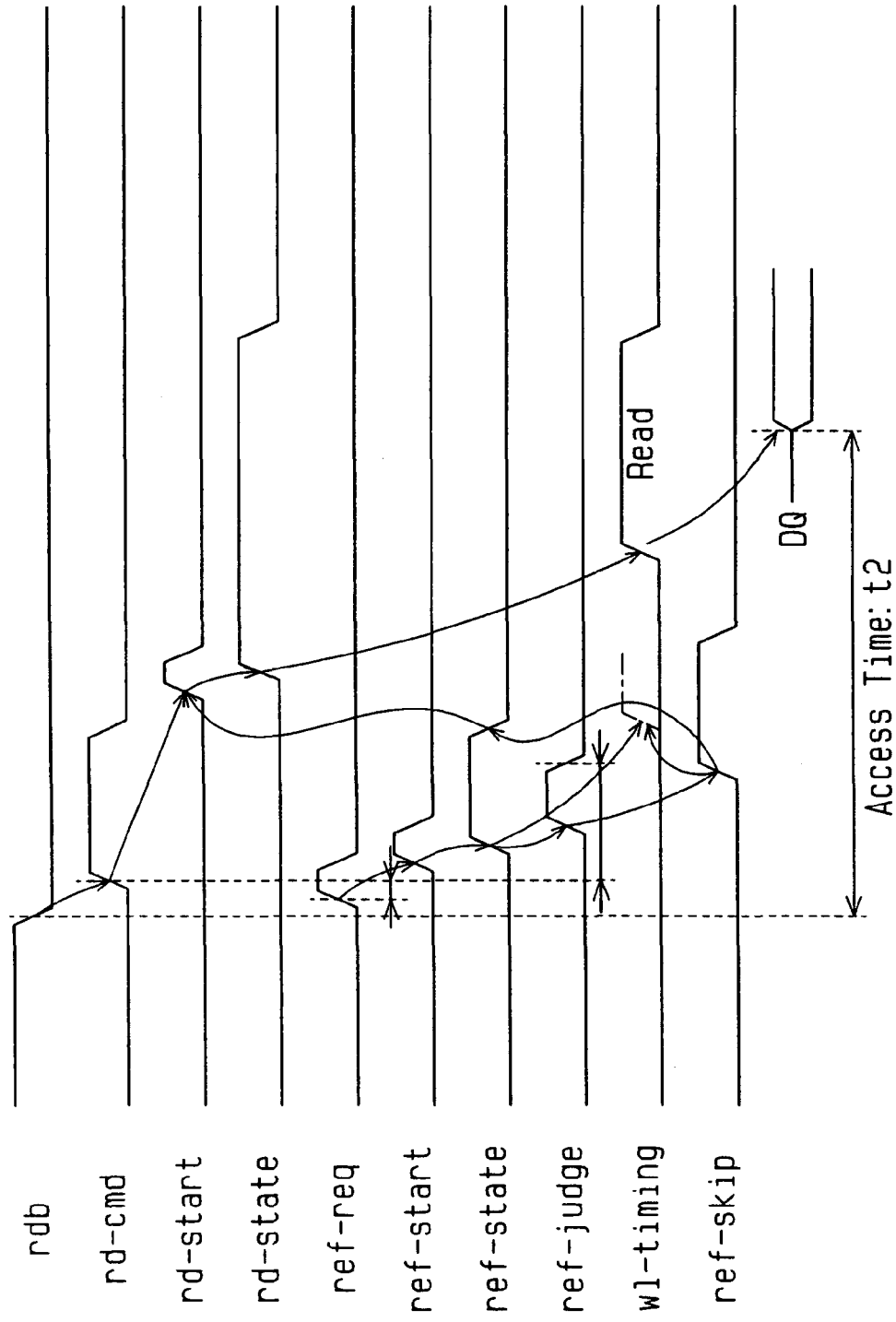

FIG. 7 is an operational waveform diagram in a case where the refresh request signal ref-req is supplied to the first refresh decision circuit 16 earlier than the read-command detection signal rd-cmd at the time there is an access contention. FIG. 7 further shows a case where the read-command detection signal rd-cmd is supplied to the second refresh decision circuit 17 while the refresh-judge timing signal ref-judge is generated.

The command detector 12 decodes the read command rdb and generates the read-command detection signal rd-cmd. The refresh request signal ref-req is supplied to the first refresh decision circuit 16 earlier than the read-command detection signal rd-cmd. The first refresh decision circuit 16 gives priority to the refresh operation and generates the refresh start signal ref-start and the refresh state signal ref-state in response to the rising of the refresh request signal ref-req. In response to the rising of the refresh state signal ref-state, the timing generator 14 generates the refresh-judge timing signal ref-judge.

At this time, the read-command detection signal rd-cmd has been supplied to the second refresh decision circuit 17. Therefore, the second refresh decision circuit 17 generates the refresh-cancel signal ref-skip.

The first refresh decision circuit 16 resets the refresh state signal ref-state in response to the rising of the refresh-cancel signal ref-skip. In response to the rising of the refresh-cancel signal ref-skip, the timing generator 14 does not generate the word-line enable timing signal wl-timing (indicated by a one-dot chain line in the diagram). Accordingly, no refresh operation is performed.

The internal command generator 15 generates the read start signal rd-start in response to the falling of the refresh state signal ref-state. The timing generator 14 generates read state signal rd-state and the word-line enable timing signal wl-timing in response to the rising of the read start signal rd-start. Then, the read operation takes place.

Once the refresh operation is given priority, in a case where the read-command detection signal rd-cmd is being supplied to the second refresh decision circuit 17 while the refresh-judge timing signal ref-judge is generated, the refresh operation is stopped and priority is given to the read operation. In this case, although an external access time t2 becomes slightly greater than the external access time t1 shown in FIG. 6, there is no access delay caused by priority being given to the refresh operation.

Figure 8:
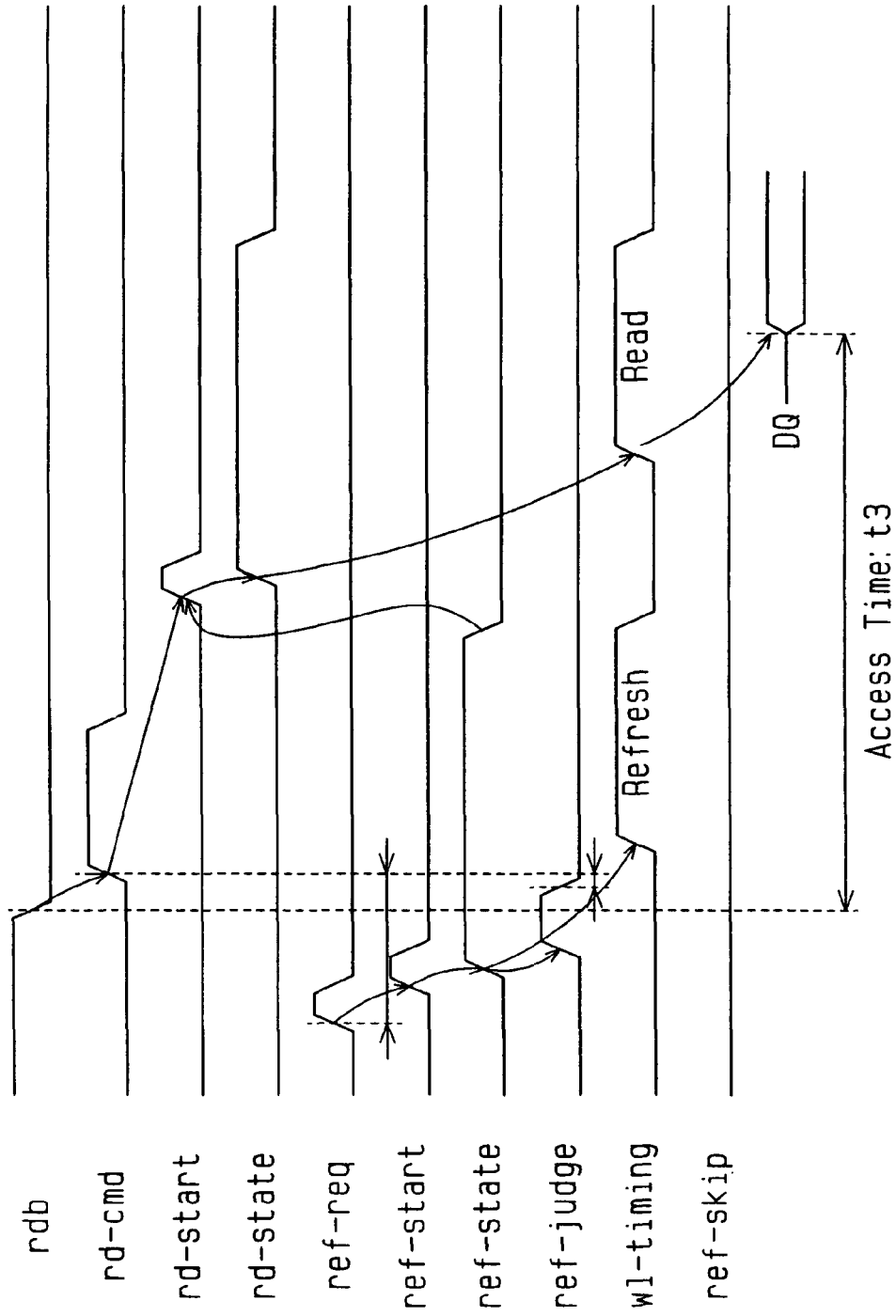

FIG. 8 shows a case where the refresh operation is given priority and an access time t3 is the largest at the time there is an access contention. In the example shown in FIG. 8, the read-command detection signal rd-cmd is generated immediately after the refresh-judge timing signal ref-judge falls.

In a case where the read-command detection signal rd-cmd is generated earlier than the timing shown in FIG. 8, the refresh operation is not carried out as shown in FIG. 7.

The command detector 12 decodes the read command rdb and generates the read-command detection signal rd-cmd. The refresh request signal ref-req is generated earlier than the read-command detection signal rd-cmd and supplied to the first refresh decision circuit 16. The first refresh decision circuit 16 gives priority to the refresh operation and generates the refresh start signal ref-start and the refresh state signal ref-state in response to the rising of the refresh request signal ref-req. In response to the rising of the refresh start signal ref-start, the timing generator 14 generates the refresh-judge timing signal ref-judge.

After the refresh-judge timing signal ref-judge falls, the read-command detection signal rd-cmd is generated and supplied to the second refresh decision circuit 17. Therefore, the second refresh decision circuit 17 does not generate the refresh-cancel signal ref-skip. As a result, the timing generator 14 generates the word-line enable timing signal wl-timing for the refresh operation, allowing the refresh operation to continue.

After the refresh operation is completed, the internal command generator 15 generates the read start signal rd-start in response to the falling of the refresh state signal ref-state. In response to the rising of the read start signal rd-start, the timing generator 14 generates the read state signal rd-state and the word-line enable timing signal wl-timing. Subsequently, the read operation takes place.

Figure 3:
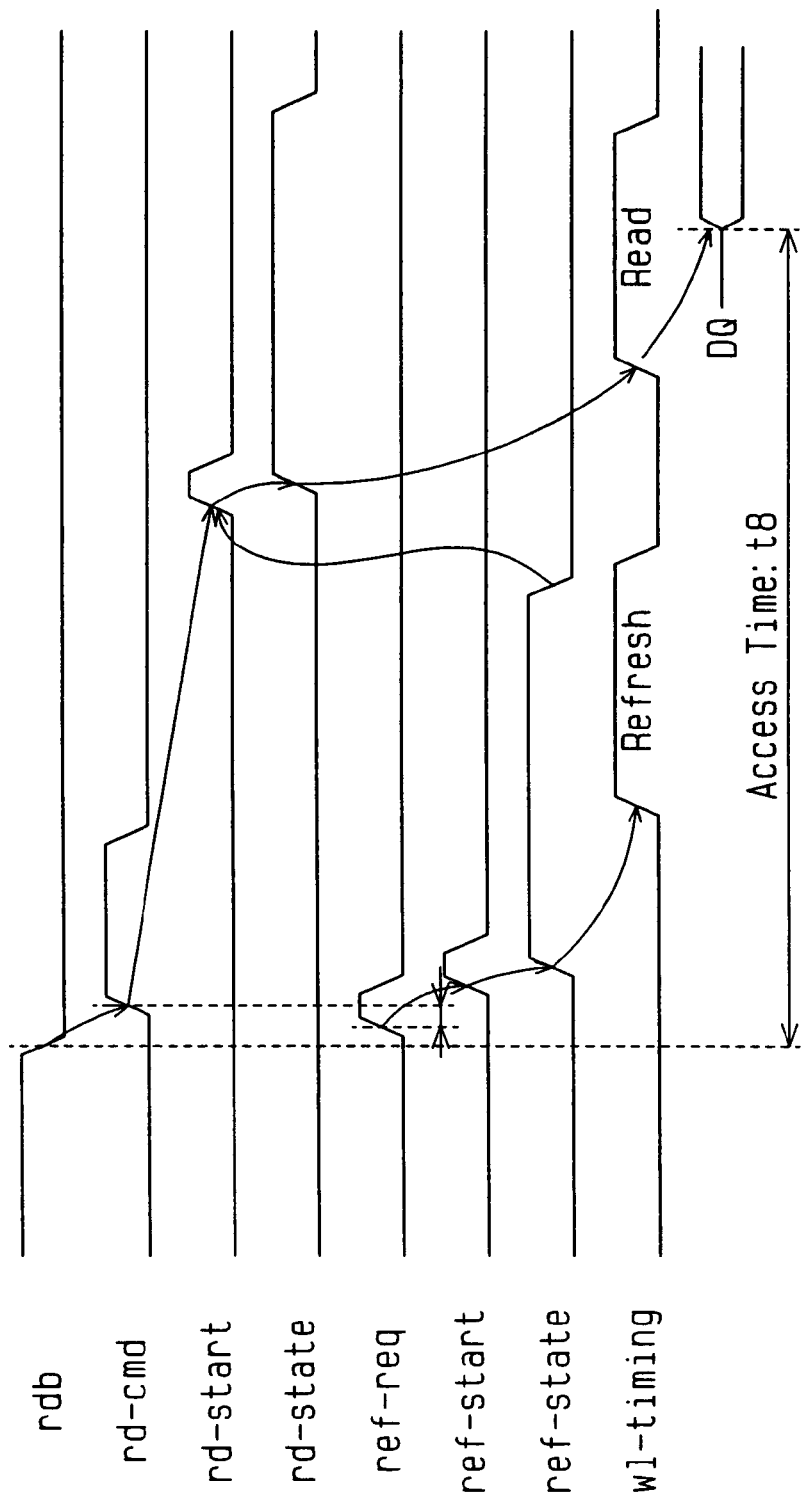

In a case where the read-command detection signal rd-cmd is generated after the falling of the refresh-judge timing signal ref-judge, as shown in FIG. 8, the refresh operation is resumed in the first embodiment. Therefore, the read operation is executed after the refresh operation is completed. The external access time t3 shown in FIG. 8 thus has an access delay originated from priority being given to the refresh operation. As the external access time t3 is the maximum access time (worst access time), however, it is shortened by (t8-t3) as compared with the conventional worst access time t8 (see FIG. 3).

It is possible to shorten the external access time not only in a case where a read operation and refresh operation contend with each other but also in a case where a write operation and refresh operation contend with each other.

The DRAM 10 according to the first embodiment has the following advantages.

(1) At the time an external access (read operation) and an internal access (refresh operation) contend with each other, once priority is given to the refresh operation, the second refresh decision circuit 17 finally determines which one of the read operation and the refresh operation should be carried out by priority in accordance with the refresh-judge timing signal ref-judge. At the time there is an access contention, therefore, the read operation can be carried out by priority until a word line which substantially corresponds to a refresh address is enabled. This can reduce an access delay at the time there is an external access.

(2) At the time there is an access contention, in a case where the DRAM 10 receives a read access from an external unit within a predetermined period after priority has been given temporarily to the refresh operation, the refresh operation is stopped. This prevents the external access from being delayed by priority being given to the refresh operation.

(3) Even in a case where a read operation is executed after the refresh operation at the time of an access contention, the external access time (worst access time) t3 is shortened by a period from the point at which the refresh operation has been given priority temporarily, to a point at which the refresh operation can be interrupted (nearly the period from the rising of the refresh request signal ref-req to the falling of the refresh-judge timing signal ref-judge).

Figure 9:
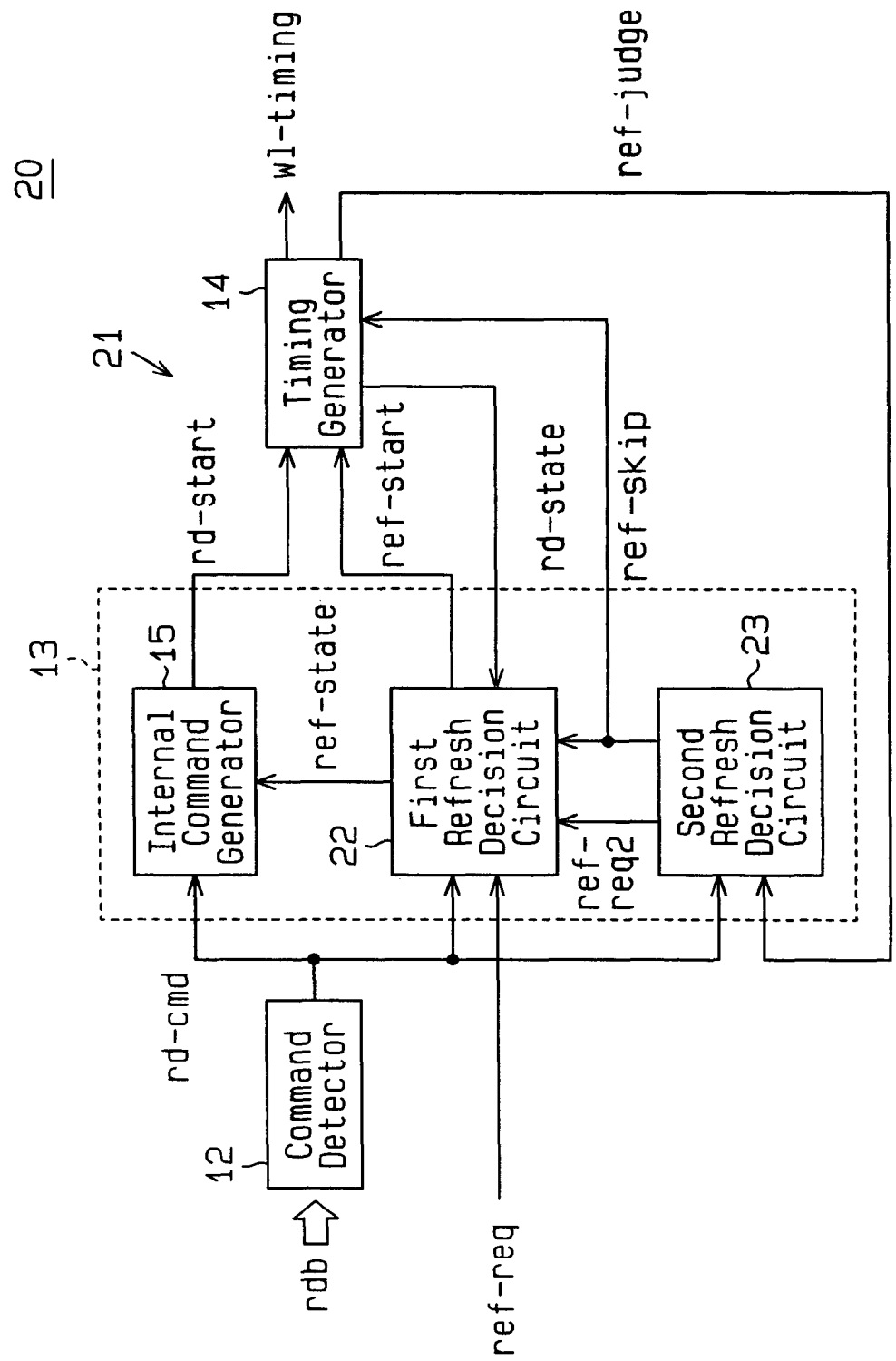
FIG. 9 is a schematic block circuit diagram of a control circuit for a semiconductor memory device according to a second embodiment of the present invention.

FIG. 9 is a schematic block circuit diagram of a control circuit 21 for a DRAM 20 according to the second embodiment of the present invention. The control circuit 21 is the control circuit 11 of the first embodiment whose first and second refresh decision circuits 16 and 17 are partly modified (see FIGS. 4 and 5).

A second refresh decision circuit 23 according to the second embodiment generates a refresh rerequest signal (regenerated second entry signal) ref-req2 after generating the refresh-cancel signal ref-skip.

After the read state signal rd-state is reset, a first refresh decision circuit 22 generates the refresh start signal ref-start and refresh state signal ref-state in response to the refresh rerequest signal ref-req2. In a case where the refresh operation is temporarily stopped in accordance with the result of decision made by the second refresh decision circuit 23, the refresh operation is executed after the read operation is completed.

Figure 10:
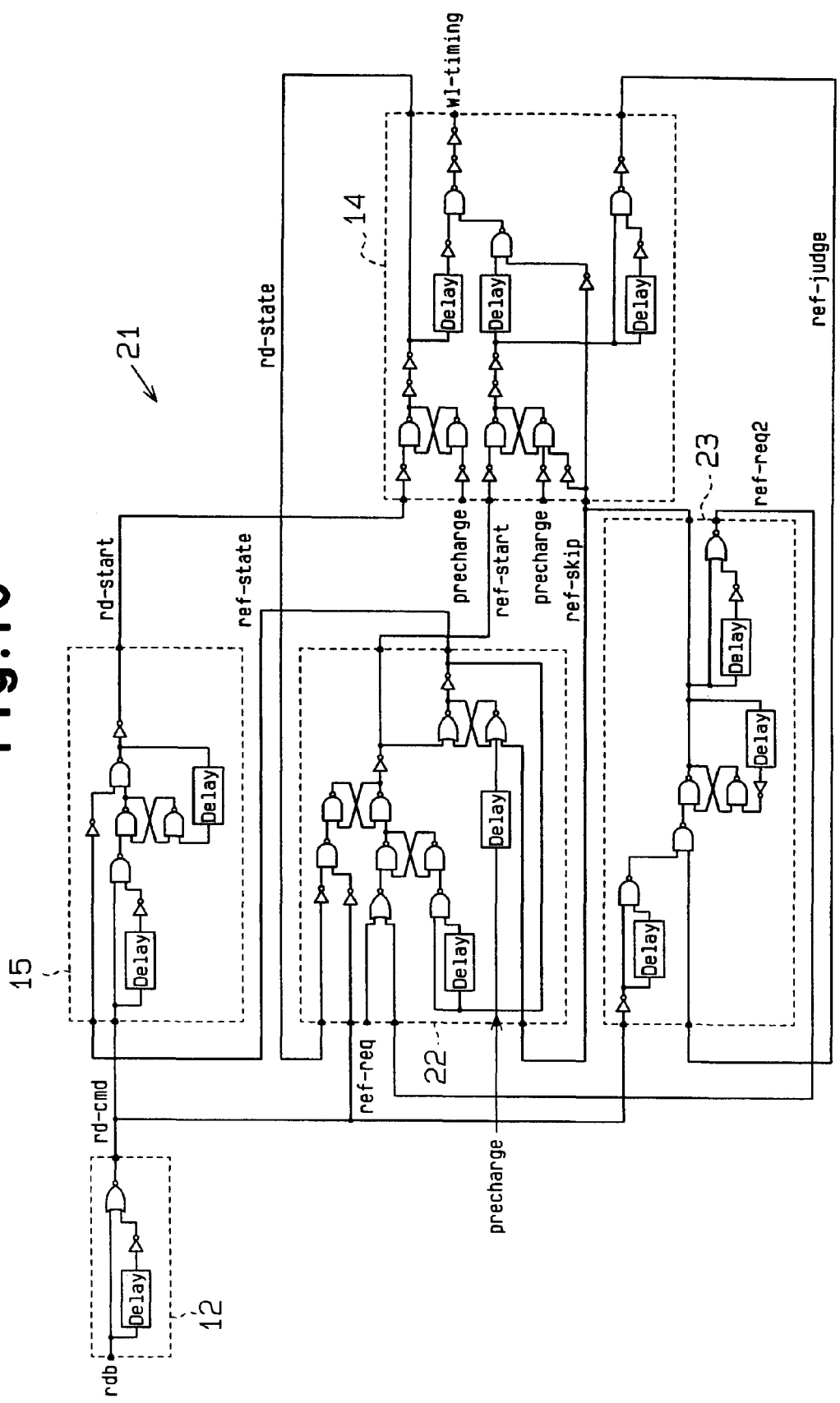
FIG. 10 is a schematic circuit diagram of the control circuit in FIG. 9.

FIG. 10 is a schematic circuit diagram of the control circuit 21 in FIG. 9. The second refresh decision circuit 23 generates the refresh rerequest signal ref-req2 of a one-shot pulse in response to the falling of the refresh-cancel signal ref-skip. Upon reception of the refresh rerequest signal ref-req2, the first refresh decision circuit 22 generates the refresh start signal ref-start after the read state signal rd-state is reset.

Figure 11:
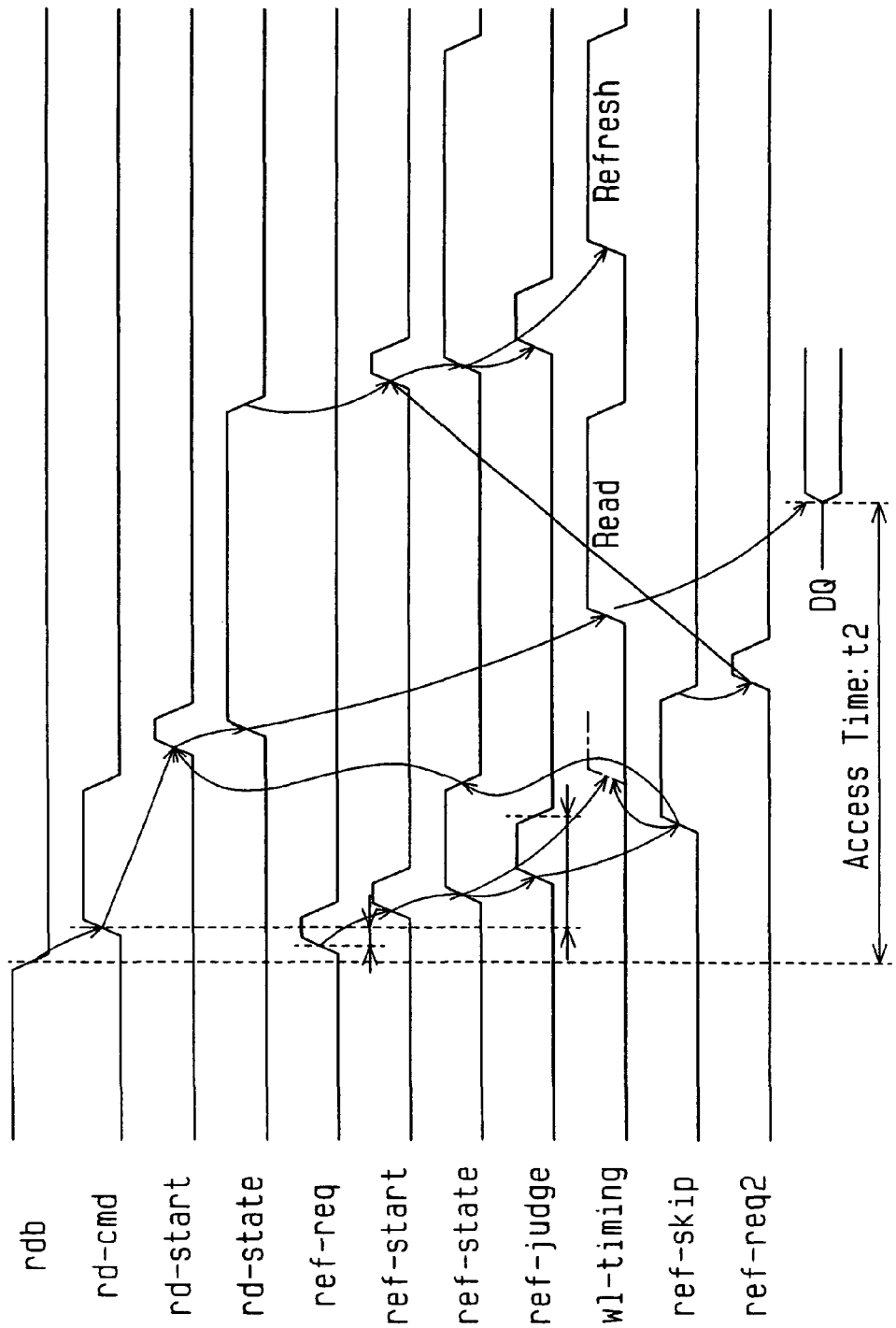
FIG. 11 is an operational waveform diagram for the semiconductor memory device in FIG. 9.

FIG. 11 is an operational waveform showing a case where the refresh rerequest signal ref-req2 is generated. After the refresh operation is given priority by the first refresh decision circuit 22, the second refresh decision circuit 23 generates the refresh-cancel signal ref-skip. In accordance with the refresh-cancel signal ref-skip, the refresh state signal ref-state is reset and the generation of the word-line enable timing signal wl-timing (indicated by a one-dot chain line in the diagram) is stopped. The refresh operation is stopped and the read operation is given priority.

The second refresh decision circuit 23 outputs the refresh rerequest signal ref-req2 after outputting the refresh-cancel signal ref-skip (after it falls).

The first refresh decision circuit 22 generates the refresh start signal ref-start and the refresh state signal ref-state in response to the refresh rerequest signal ref-req2 at the falling of the read state signal rd-state. The refresh operation that has been stopped temporarily is executed after the read operation is completed.

The DRAM 20 according to the second embodiment has the following advantages.

The second refresh decision circuit 23 generates the refresh rerequest signal ref-req2 in accordance with the refresh-cancel signal ref-skip. Even in a case where the refresh operation is interrupted and the read operation is given priority, therefore, the interrupted refresh operation is carried out after the read operation is completed. This prevents cell data from being damaged.

Figure 12:
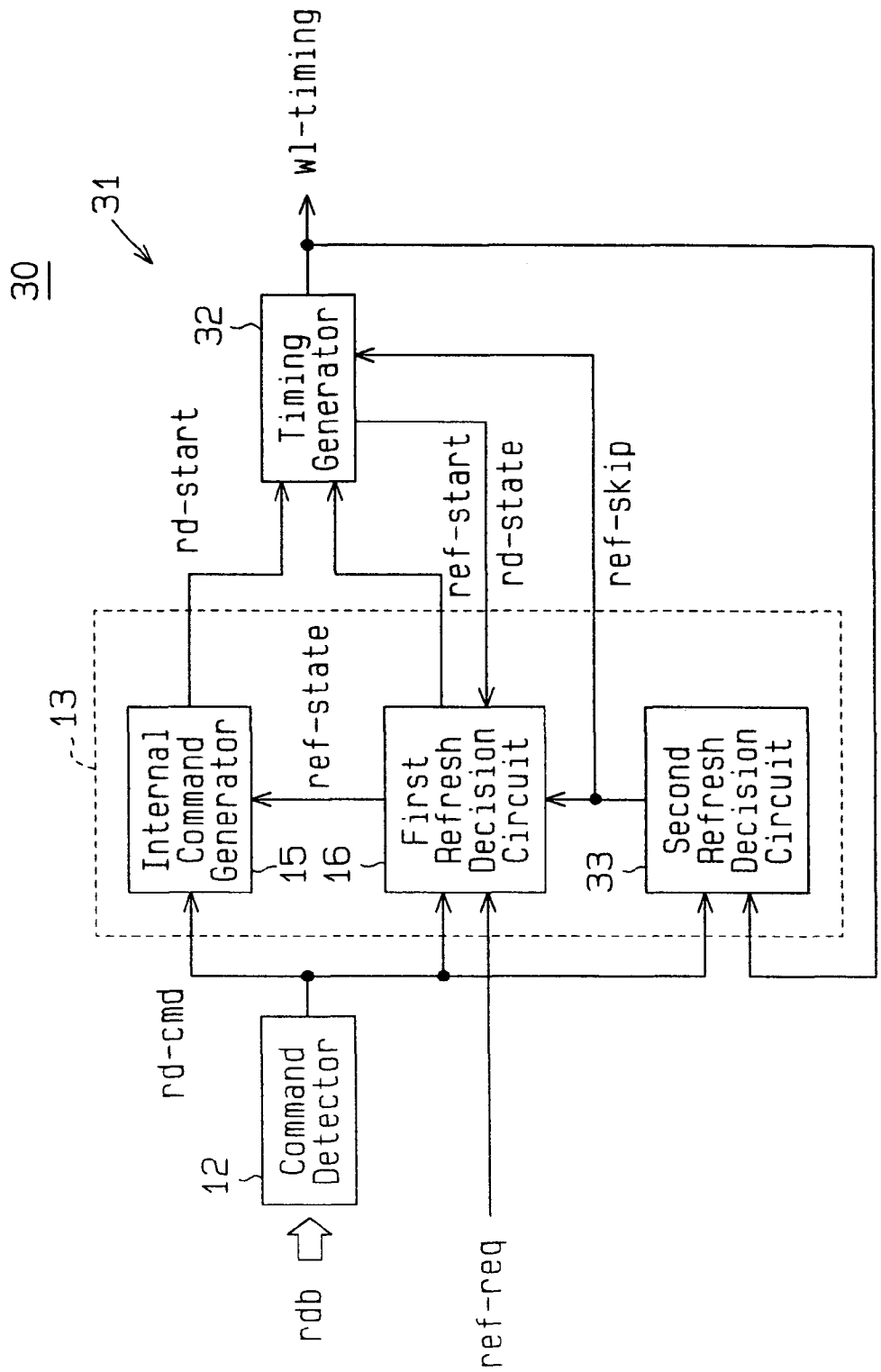
FIG. 12 is a schematic block circuit diagram of a control circuit for a semiconductor memory device according to a third embodiment of the present invention.

FIG. 12 is a schematic block circuit diagram of a control circuit 31 of a DRAM 30 according to the third embodiment of the present invention. The control circuit 31 according to the third embodiment is the control circuit 11 of the first embodiment whose timing generator 14 and second refresh decision circuit 17 are partly modified.

In the third embodiment, a timing generator 32 does not generate the refresh-judge timing signal ref-judge and a second refresh decision circuit 33 receives the word-line enable timing signal wl-timing from the timing generator 32.

In a case where the second refresh decision circuit 33 receives the read-command detection signal rd-cmd before receiving the word-line enable timing signal wl-timing after the refresh operation has been given priority temporarily, the second refresh decision circuit 33 stops the refresh operation and gives priority to the read operation. In other words, in a case where the second refresh decision circuit 33 has already received the word-line enable timing signal wl-timing when receiving the read-command detection signal rd-cmd, the second refresh decision circuit 33 continues the refresh operation.

Figure 13:
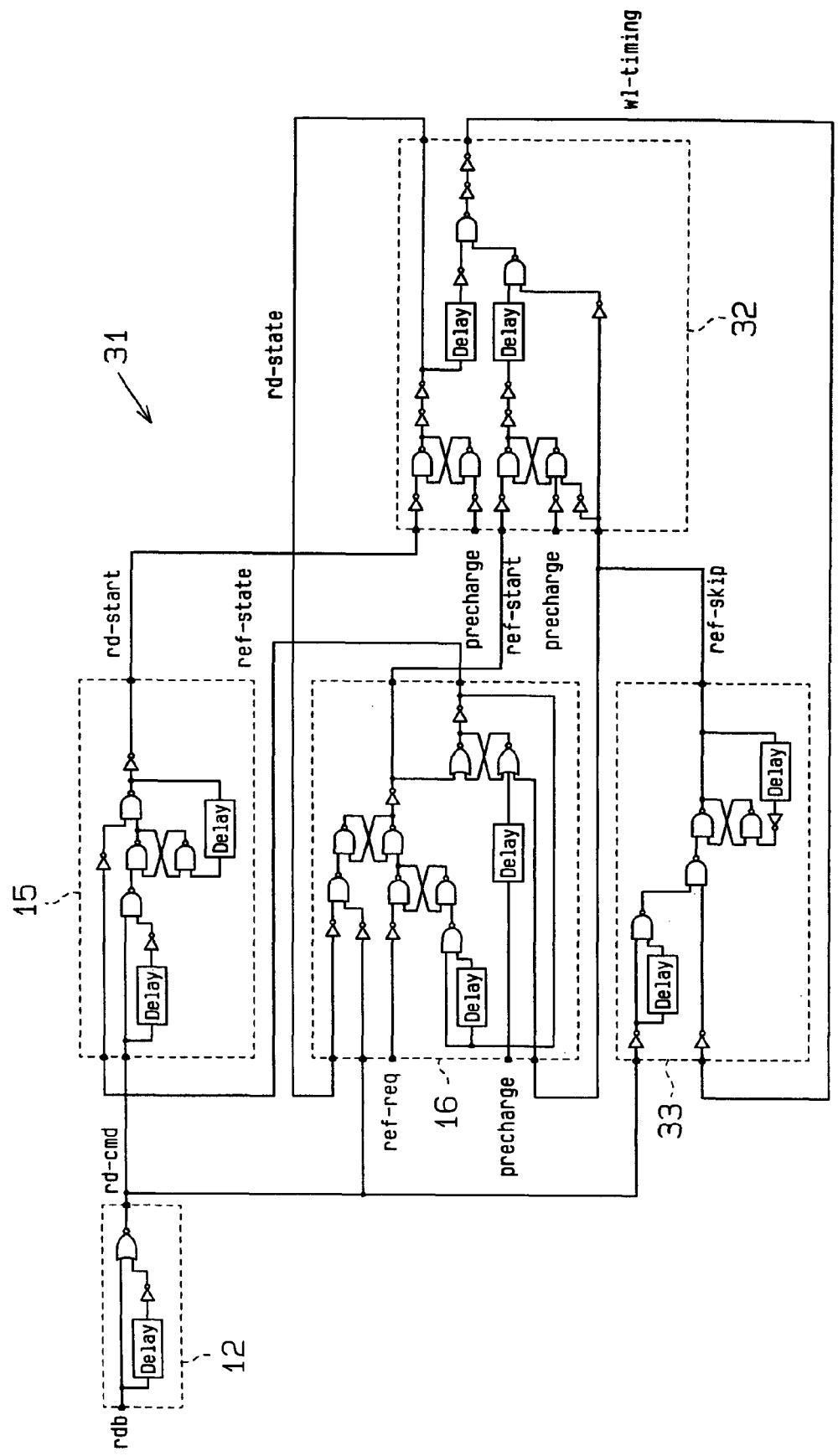
FIG. 13 is a schematic circuit diagram of the control circuit in FIG. 12

FIG. 13 is a schematic circuit diagram of the control circuit 31. When receiving the read-command detection signal rd-cmd, the second refresh decision circuit 33 determines whether the word-line enable timing signal wl-timing has already been supplied or not. In a case where the word-line enable timing signal wl-timing has not been supplied yet, the second refresh decision circuit 33 generates the refresh-cancel signal ref-skip in response to the read-command detection signal rd-cmd. In a case where the word-line enable timing signal wl-timing has already been supplied, on the other hand, the second refresh decision circuit 33 does not generate the refresh-cancel signal ref-skip.

Figure 14:
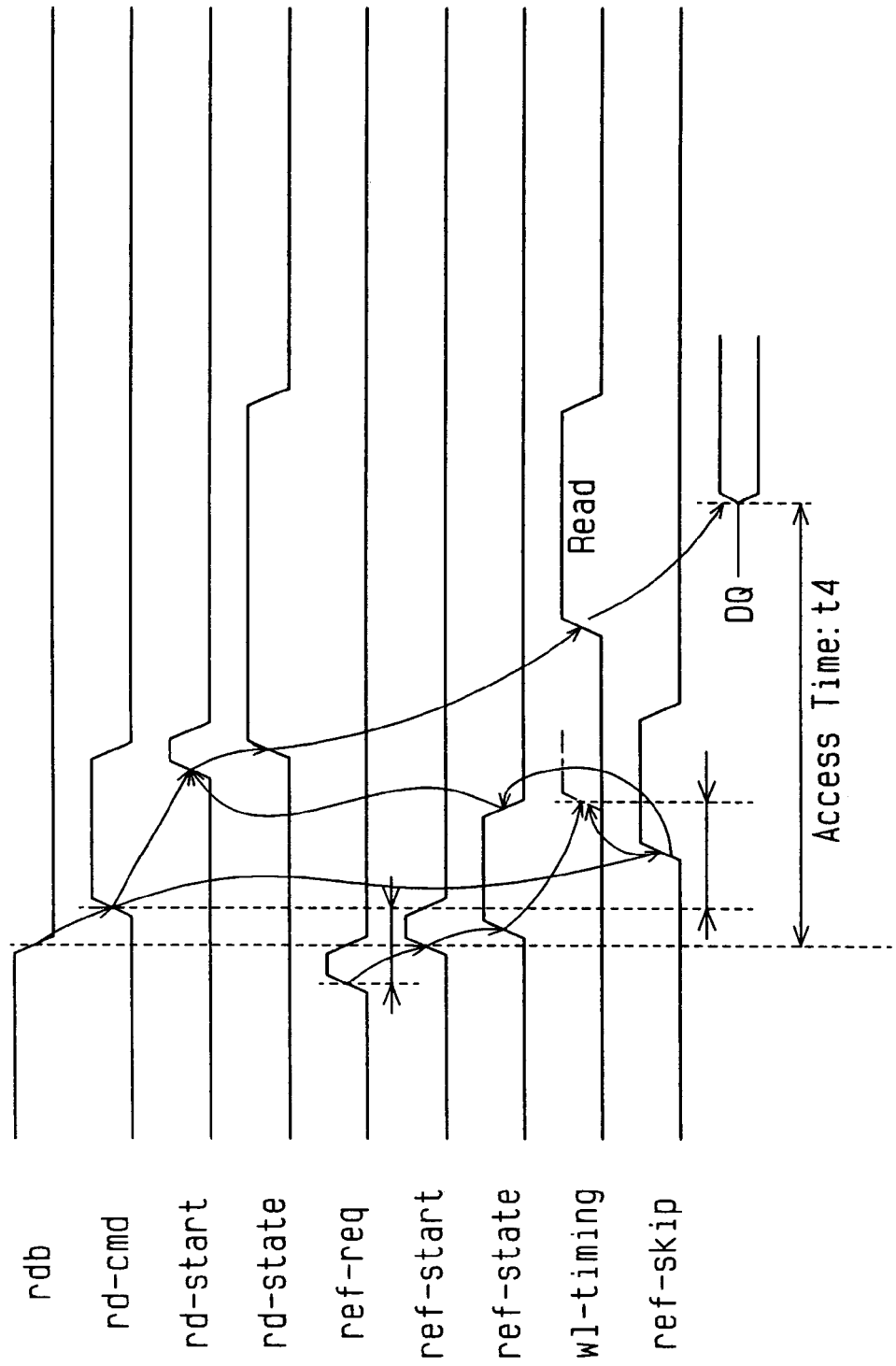
FIGS. 14 and 15 are operational waveform diagrams for the semiconductor memory device in FIG. 12.

FIG. 14 is an operational waveform diagram showing a case where with an access contention present, the read-command detection signal rd-cmd is supplied to the second refresh decision circuit 33 at an earlier timing than the word-line enable timing signal wl-timing that is generated at the time of the refresh operation. The first refresh decision circuit 16 gives priority to the refresh operation as an internal access and generates the refresh start signal ref-start and the refresh state signal ref-state in response to the rising of the refresh request signal ref-req.

Next, the second refresh decision circuit 33 receives the read-command detection signal rd-cmd. At this time, the timing generator 32 has not generated the word-line enable timing signal wl-timing (indicated by a one-dot chain line in the diagram). That is, the second refresh decision circuit 33 receives the read-command detection signal rd-cmd in the situation where a word line associated with refreshing has not been enabled yet. Therefore, the second refresh decision circuit 33 generates the refresh-cancel signal ref-skip in response to the rising of the read-command detection signal rd-cmd.

The refresh-cancel signal ref-skip resets the refresh state signal ref-state and stops the generation of the word-line enable timing signal wl-timing. As a result, the refresh operation is stopped and the read operation is given priority.

Figure 15:
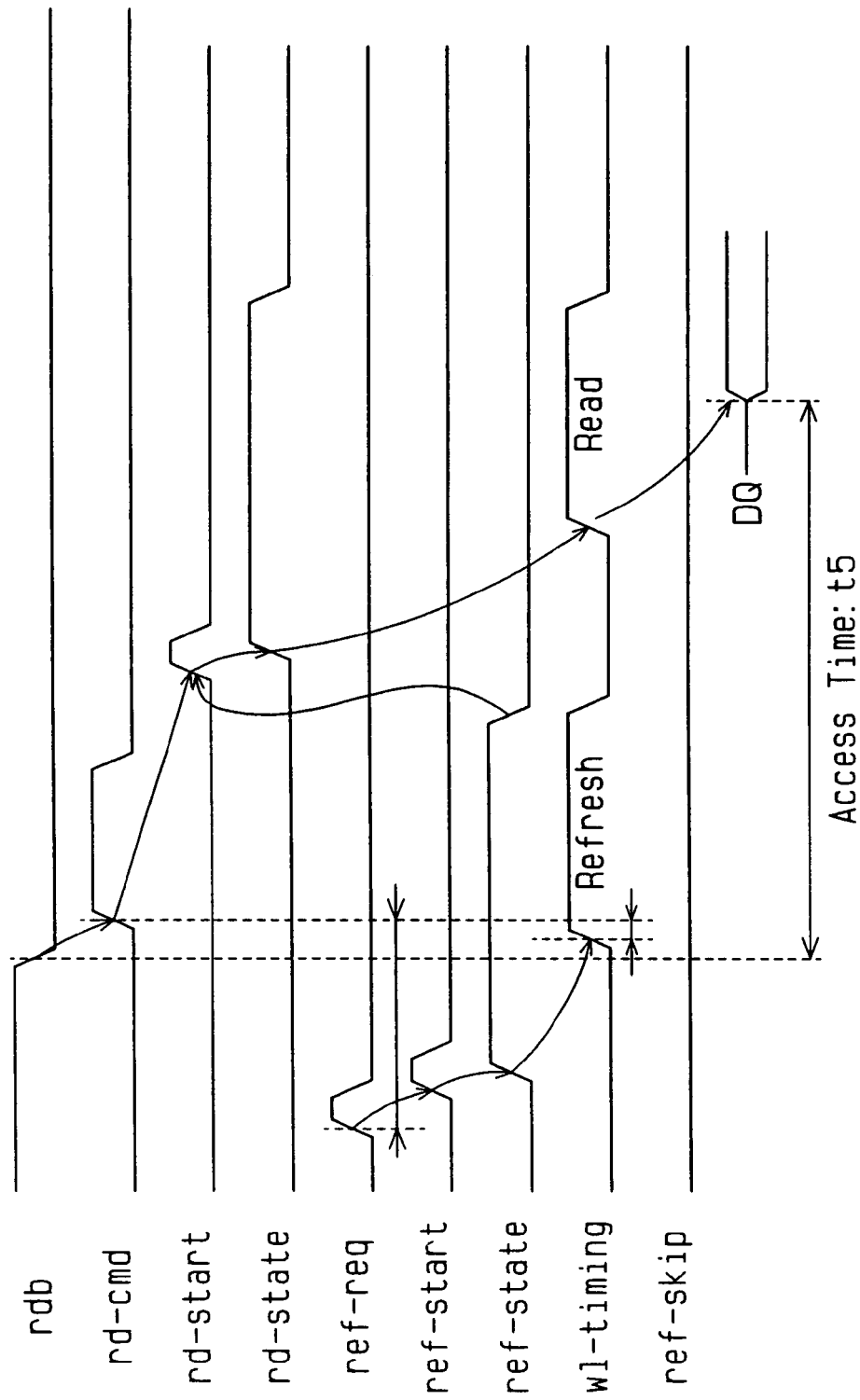

FIG. 15 is an operational waveform diagram showing a case where with an access contention present, the read-command detection signal rd-cmd is supplied to the second refresh decision circuit 33 at a later timing than the generation of the word-line enable timing signal wl-timing associated with refreshing.

The first refresh decision circuit 16 gives priority to the refresh operation and generates the refresh start signal ref-start and the refresh state signal ref-state in response to the rising of the refresh request signal ref-req. In response to the rising of the refresh start signal ref-start, the timing generator 32 generates the word-line enable timing signal wl-timing.

Then, the second refresh decision circuit 33 receives the read-command detection signal rd-cmd under the situation where a word line associated with refreshing is enabled. At this time, the second refresh decision circuit 33 does not generate the refresh-cancel signal ref-skip. Therefore, the refresh operation continues without being stopped.

In a case where the read-command detection signal rd-cmd is supplied to the second refresh decision circuit 33 at a later timing than the word-line enable timing signal wl-timing after priority has been given temporarily to the refresh operation, the read operation is executed after the refresh operation is completed.

The DRAM 30 according to the third embodiment has the following advantage.

The second refresh decision circuit 33 determines which one of the read operation and refresh operation should be given priority, based on the word-line enable timing signal wl-timing output from the timing generator 32 at the time of executing the refresh operation. That is, the read operation is given priority until a word line corresponding to a refresh address is enabled. As this structure eliminates the need for the refresh-judge timing signal ref-judge, it can make the circuit structure simpler than the first embodiment.

Figure 16:
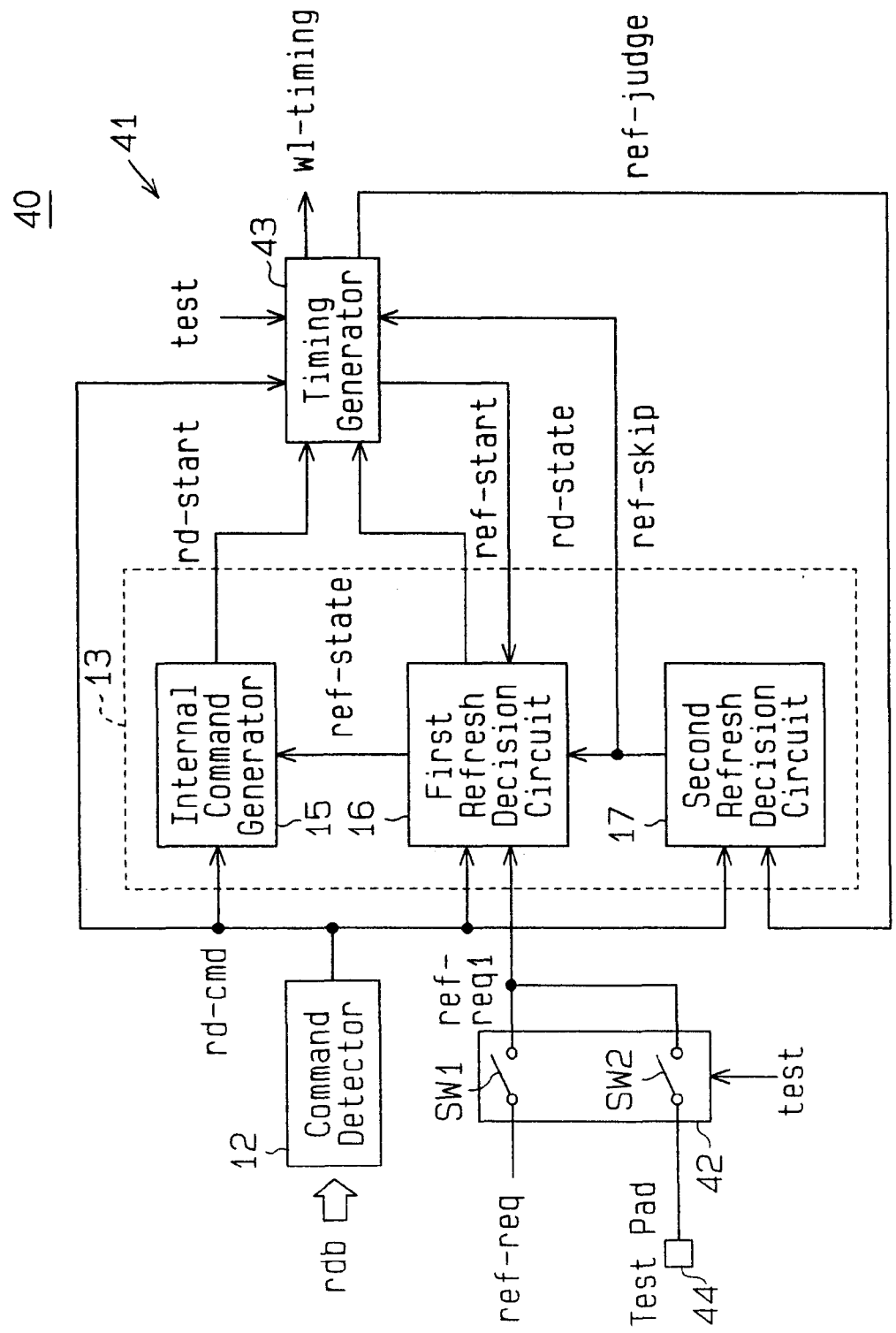
FIG. 16 is a schematic block circuit diagram of a semiconductor memory device according to a fourth embodiment of the present invention.

FIG. 16 is a schematic block circuit diagram of a control circuit 41 for a DRAM 40 according to the fourth embodiment of the present invention. The control circuit 41 of the fourth embodiment is the control circuit 11 of the first embodiment to which a mode switching circuit 42 is added. In the fourth embodiment, at the time of an access contention, a test mode is executed to reproduce a quasi state where the external access time becomes maximum (worst case) and conduct a test.

The control circuit 41 includes the mode switching circuit 42, the command detector 12, the arbiter 13 and a timing generator 43. The mode switching circuit 42 switches between the test mode and the normal mode in accordance with a test signal test. Specifically the mode switching circuit 42 complimentarily sets switches SW1 and SW2 on or off in response to the test signal test to output the refresh request signal ref-req in normal mode and output a pulse signal (ref-req1) which is supplied from a test pad 44 (exclusive test terminal).

The timing generator 43 is controlled by the test signal test. Specifically, when receiving the refresh start signal ref-start in test mode, the timing generator 43 generates the word-line enable timing signal wl-timing in response to the read-command detection signal rd-cmd.

Figure 17:
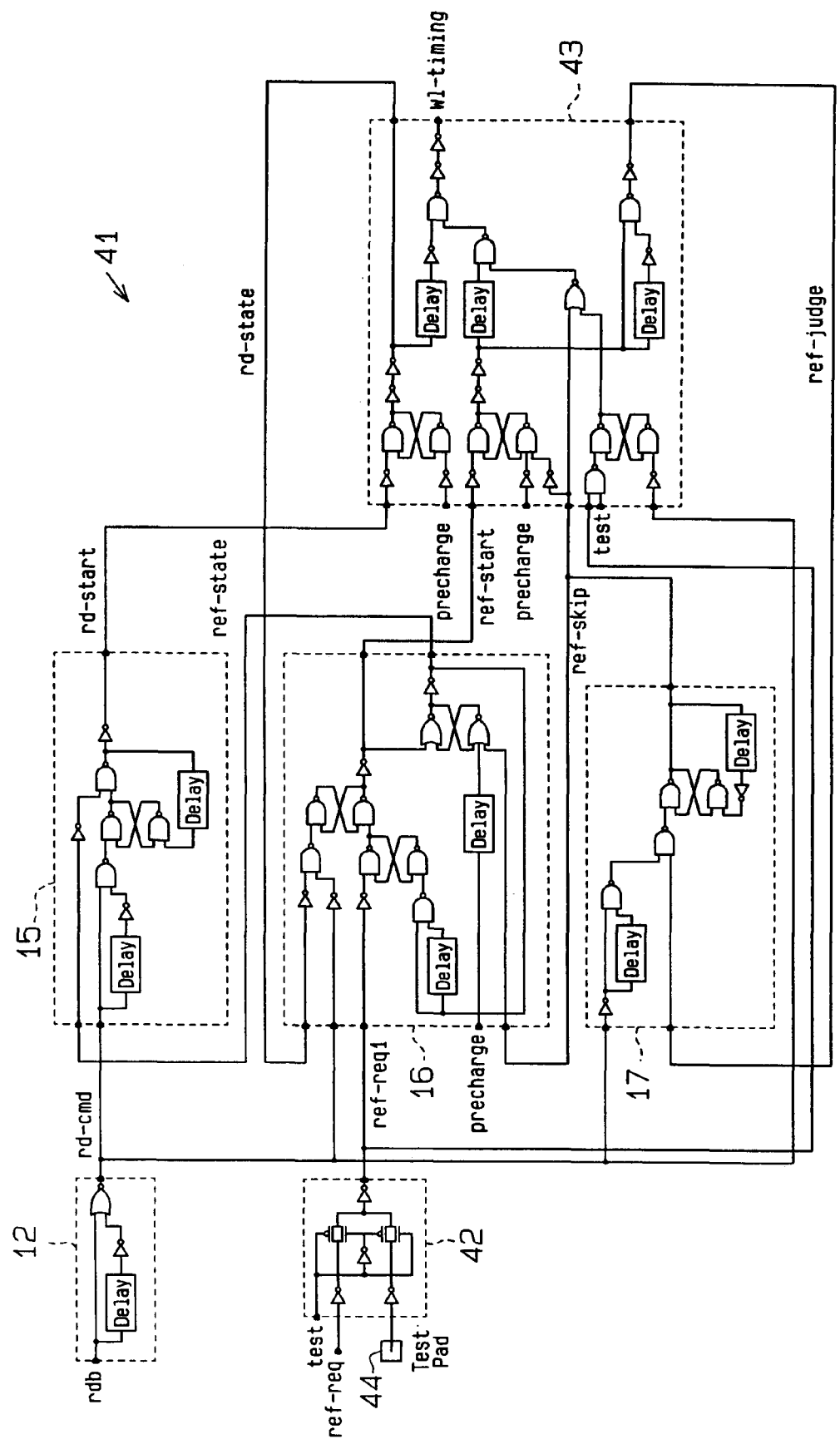
FIG. 17 is a schematic circuit diagram of the semiconductor memory device in FIG. 16.

FIG. 17 is a schematic circuit diagram of the control circuit 41. The mode switching circuit 42 switches the mode to the test mode in response to the test signal test of, for example, an H level, and switches the mode to the normal mode in response to the test signal test of an L level.

When the H-level test signal test is supplied, the timing generator 43 operates as the test mode. In test mode, when the timing generator 43 receives the read-command detection signal rd-cmd after the first refresh decision circuit 16 has received the refresh request signal ref-req1, the timing generator 43 generates the word-line enable timing signal wl-timing.

Figure 18:
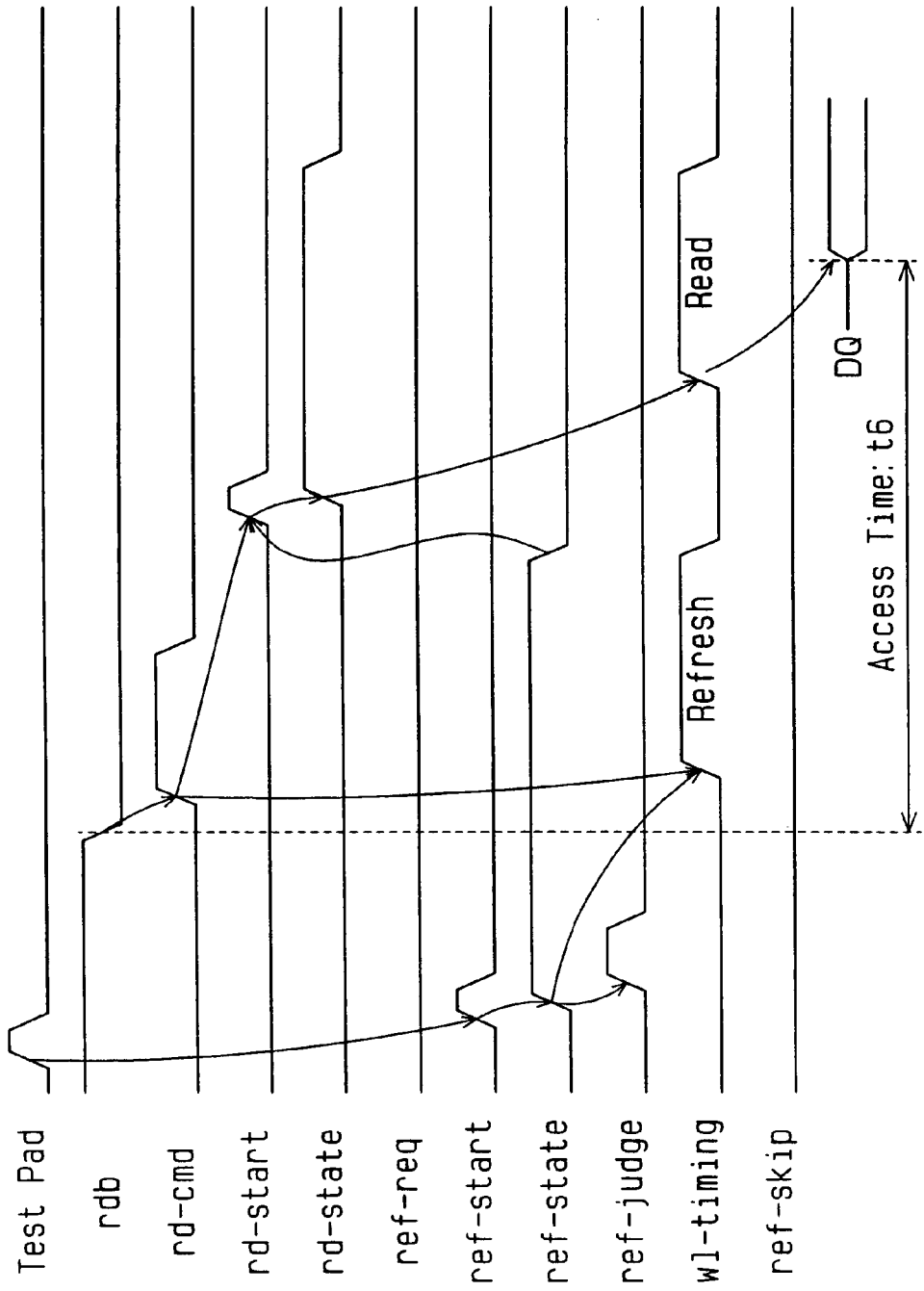
FIG. 18 is an operational waveform diagram for the semiconductor memory device in FIG. 16.

FIG. 18 is an operational waveform diagram for the DRAM 40 in test mode. When a predetermined pulse signal is supplied to the test pad 44, the output signal ref-req1 of the mode switching circuit 42 is supplied to the first refresh decision circuit 16 as a substitute signal for the refresh request signal ref-req.

In response to the rising of the output signal ref-req1, the first refresh decision circuit 16 generates the refresh start signal ref-start and the refresh state signal ref-state. In response to the rising of the refresh start signal ref-start, the timing generator 43 generates the refresh-judge timing signal ref-judge.

When the command detector 12 generates the read-command detection signal rd-cmd in accordance with the read command rdb, the timing generator 43 generates the word-line enable timing signal wl-timing in response to the rising of the read-command detection signal rd-cmd. In accordance with the signal wl-timing, a word line associated with refreshing is enabled and the refresh operation is carried out.

After the refresh operation is completed, the internal command generator 15 generates the read start signal rd-start in response to the falling of the refresh state signal ref-state. The timing generator 43 generates the read state signal rd-state and the word-line enable timing signal wl-timing in response to the rising of the read start signal rd-start. A word line associated with the read operation is enabled and cell data is read out.

In a case where the refresh operation is started, triggered by the input of the read-command detection signal rd-cmd, and the read operation is executed after the refresh operation is completed, an external access time t6 becomes maximum.

In general, the time from the supply of the refresh request signal ref-req to the first refresh decision circuit 16 to the generation of the word-line enable timing signal wl-timing according to the refresh request signal ref-req varies due to the influence of the process or the like. Therefore, the time for the word-line enable timing signal wl-timing to be generated in response to the refresh start signal ref-start varies.

As mentioned in the foregoing description of the first embodiment, in a case where the read-command detection signal rd-cmd is generated immediately after the falling of the refresh-judge timing signal ref-judge, the read operation is executed after the refresh operation is completed. In this case, the external access time becomes maximum.

If the timing for generating the word-line enable timing signal wl-timing varies, however, the external access time accordingly also varies. This disables the reproduction with high accuracy of the state where the external access time becomes maximum. In test mode, therefore, the word-line enable timing signal wl-timing is generated, triggered by the rising of the read-command detection signal rd-cmd, thereby allowing the maximum value of the external access time to be measured accurately.

Figure 19:
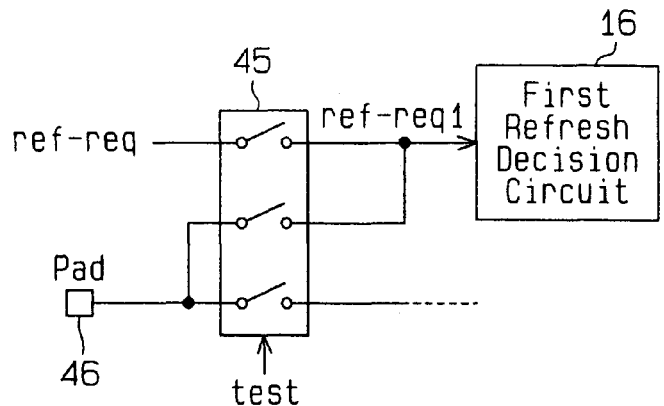
FIG. 19 is a schematic block circuit diagram of another mode switching circuit of the semiconductor memory device in FIG. 16.

In place of the test pad 44 (external terminal), a pad (another external terminal) 46 may be connected to a mode switching circuit 45 as shown in FIG. 19 so that the test in the fourth embodiment may be conducted using the pad 46. In this case, a test can be carried out even after the DRAM is assembled.

Figure 20:
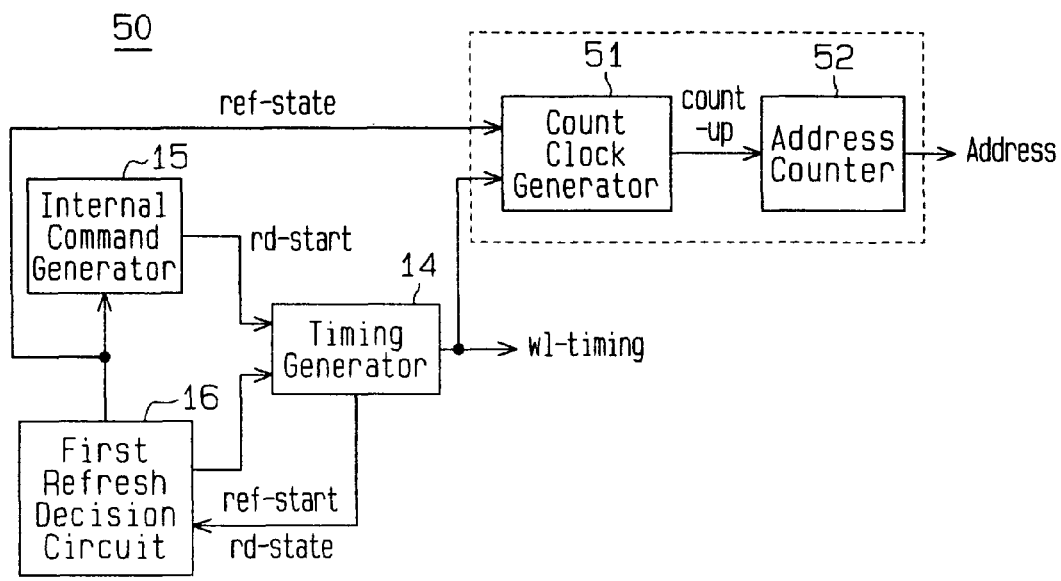
FIG. 20 is a schematic block circuit diagram of a semiconductor memory device according to a fifth embodiment of the present invention.

FIG. 20 is a schematic block circuit diagram of a DRAM 50 according to the fifth embodiment of the invention. Specifically, FIG. 20 is a block circuit diagram for explaining the setting of an address associated with the refresh operation of the DRAM 50 (refresh address).

A count clock generator (address generating circuit) 51 is connected to the first refresh decision circuit 16 and the timing generator 14. An address counter 52 is connected to the count clock generator 51.

Figure 21:
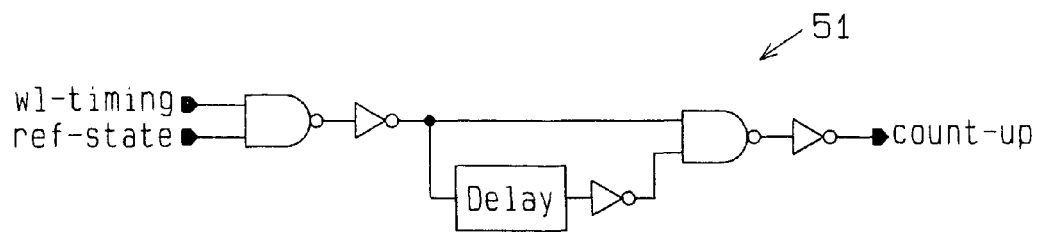
FIG. 21 is a schematic circuit diagram of a count clock generator of the semiconductor memory device in FIG. 20.

During the refresh operation, the count clock generator 51 generates a count-up signal (address generation signal) count-up when detecting the supply of the word-line enable timing signal wl-timing while the refresh state signal ref-state is being supplied. The address counter (address generating circuit) 52 counts up in accordance with the count-up signal count-up and generates an address to be used in the next refresh cycle. FIG. 21 is a schematic circuit diagram of the count clock generator 51.

As the count clock generator 51 generates the count-up signal count-up only when a word line is enabled and the refresh operation actually takes place, the generation of a next address is prevented in a case where the refresh operation is stopped. This makes it possible to reliably execute the refresh operation, temporarily stopped, in the next refresh cycle.

It should be apparent to those skilled in the art that the present invention may be embodied in many other specific forms without departing from the spirit or scope of the invention. Particularly, it should be understood that the invention may be embodied in the following forms.

The second refresh decision circuits 17, 23 and 33 in the first to third embodiments may incorporate a time setting circuit which sets the period in which the refresh operation can be interrupted (the predetermined period in the first embodiment). In this case, the second refresh decision circuit stops the refresh operation when receiving the read-command detection signal rd-cmd in a period equivalent to the generation time for the refresh-judge timing signal ref-judge.

The second refresh decision circuit 23 in the second embodiment may be adapted to the DRAMs 30 and 40 of the third and fourth embodiments.

The second refresh decision circuit 33 in the third embodiment may be adapted to the DRAMs 20 and 40 of the second and fourth embodiments.

The count clock generator 51 in the fifth embodiment may be adapted to the DRAMs 20, 30 and 40 of the second, third and fourth embodiments.

The count clock generator 51 in the fifth embodiment may generate the count-up signal count-up in accordance with the refresh start signal ref-start or the refresh state signal ref-state in place of the word-line enable timing signal wl-timing. In this case, the count-up signal count-up is not generated in the next refresh cycle when the refresh-cancel signal ref-skip is generated.

In each embodiment, an external access may be a write operation (write command).

The control circuit 11, 21, 31 or 41 (FIG. 5, 10, 13 or 17) of each embodiment and the count clock generator 51 (FIG. 21) may take an arbitrary logic structure.

Therefore, the present examples and embodiments are to be considered as illustrative and not restrictive and the invention is not to be limited to the details given herein, but may be modified within the scope and equivalence of the appended claims.

What is claimed is:
1. A semiconductor device comprising:
a plurality of word lines;
an arbiter configured to receive a first entry signal for entering the first access mode and a second entry signal for entering the second access mode, to determine priority of the first and second access modes, and to generate a first mode trigger signal corresponding to a first entry mode and a second mode trigger corresponding to a second entry mode; and
a signal generating circuit, configured to generate an internal operation signal in accordance with at least one of the first mode trigger signal and the second mode trigger signal, wherein the arbiter gives priority to the first access mode when the arbiter receives the first entry signal during the time after the second entry signal is supplied and before a predetermined word line of the plurality of word lines is enabled in the second access mode.

wherein the predetermined period comprises a period from a point at which the second entry signal is enabled to a point at which a predetermined word line of the plurality of word lines is enabled in the second access mode.

2. The semiconductor device according to claim 1, wherein the arbiter determines whether the first entry signal has been supplied within a predetermined period or not in accordance with the internal operation signal.

3. The semiconductor device according to claim 1, wherein
the internal operation signal is used as a decision signal indicating whether or not a predetermined word line is enabled in the second access mode.

4. The semiconductor device according to claim 1, wherein
the signal generating circuit generates a word-line enable signal for enabling the predetermined word line in the second access mode.

5. The semiconductor memory device according to claim 4, further comprising an address generating circuit that generates an address to be used in the second access mode in accordance with the word-line enable signal.

6. The semiconductor memory device according to claim 5, wherein the arbiter generates a state signal indicative of the second access mode in accordance with the second entry signal, and
the address generating circuit generates the address in accordance with the state signal and the word-line enable signal.

7. The semiconductor device according to claim 1, wherein the arbiter includes:
a first decision circuit which receives the first entry signal and the second entry signal and determines priority of the first and second access modes,
a second decision circuit that determines whether the first entry signal has been supplied within the predetermined period or not, and
a mode trigger generating circuit that generates the first mode trigger signal in accordance with the determined priority, and
wherein the mode trigger generating circuit generates the first mode trigger signal when the first entry signal is supplied to the second decision circuit within the predetermined period.

8. The semiconductor device according to claim 7, wherein the second decision circuit generates a cancel signal to stop execution of the second access mode when the first entry signal is supplied within the predetermined period.

9. The semiconductor device according to claim 8, wherein after generating the cancel signal, the second decision circuit generates the second entry signal again to execute the second access mode after execution of the first access mode.

10. The semiconductor device according to claim 1, further including an address generating circuit that generates an address to be used for the second access mode, and
wherein the address generating circuit does not generate the address when the arbiter determines the first access mode has priority.

11. The semiconductor device according to claim 1, wherein the arbiter includes a time setting unit that determines whether the first entry signal has been supplied within the predetermined period or not.

12. The semiconductor device according to claim 1, further comprising an exclusive test terminal that supplies the second entry signal in a test mode.

13. The semiconductor device according to claim 12, wherein
the internal operation signal includes a word-line enable signal to enable a predetermined word line in the second access mode, and
the signal generating circuit suppresses generation of the word-line enable signal in accordance with a test signal.

14. The semiconductor device according to claim 12, wherein in the test mode, the signal generating circuit receives the first entry signal and generates the word-line enable signal.

15. The semiconductor device according to claim 1, wherein the device has a test mode and further comprises an external terminal to which the second entry signal for the test mode is supplied.

16. The semiconductor device according to claim 1, wherein the first access mode corresponds to a read or write operation mode and the second access mode corresponds a self-refresh operation mode.

17. The semiconductor device according to claim 1, wherein
the internal operation signal includes a word-line enable signal for enabling a predetermined word line in the second access mode, and
the predetermined period comprises a period from a point at which the second entry signal is enabled prior to enabling of the first entry signal to a point at which the word-line enable signal is enabled.

18. The semiconductor device according to claim 1, further comprising a command detector circuit that receives an external command and generates the first entry signal.

19. The semiconductor device according to claim 1, further comprising an internal circuit that generates the second entry signal.

20. The semiconductor device according to claim 1, wherein the first access mode corresponds to an external access operation and the second access mode corresponds to an internal access operation.

21. A semiconductor device comprising:
a plurality of word lines, and
an arbiter configured to receive a first entry signal for entering a first access mode and a second entry signal for entering a second access mode, to determine priority of the first and second access modes and to generate a first mode trigger signal corresponding to a first entry mode and a second mode trigger signal corresponding to a second entry mode,
wherein the arbiter gives priority to the first access mode when the arbiter receives the first entry signal during the time after the second entry signal is supplied and before a predetermined word line of the plurality of word lines is enabled in the second access mode.

22. The semiconductor device according to claim 21, further comprising a signal generating circuit configured to generate an internal operation signal in accordance with at least one of a first mode trigger signal corresponding to the first entry signal and a second mode trigger signal corresponding to the second entry signal.

23. The semiconductor device according to claim 22, wherein
the internal operation signal includes a word-line enable signal for enabling a predetermined word line in the second access mode.

24. The semiconductor device according to claim 22, wherein the internal operation signal is generated during the time after the second entry signal is supplied and before a predetermined word line of the plurality of word lines is enabled in the second access mode.

25. A method for controlling a semiconductor memory device having a first access mode and a second access mode, the method comprising:
   determining priority of the first and second access modes in accordance with a first entry signal for entering the first access mode and a second entry signal for entering the second access mode;
   executing the second access mode when the second access mode is determined to have priority;
   detecting if the first entry signal has been supplied within a predetermined period after execution of the second access mode has been started and before a predetermined word line of a plurality of word lines is enabled in the second access mode; and
   executing the first access mode by priority over the second access mode when the first entry signal is detected.

26. The method according to claim 25, wherein the step of executing the first access mode includes stopping execution of the second access mode.

27. The method according to claim 26, further comprising the step of executing the second access mode after the stopping, and execution of the first access mode.

28. The method according to claim 26, further comprising the step of stopping generation of an address of the predetermined word line for the second access mode of the semiconductor memory device if the stopping of execution of the second access mode is performed.

29. The method according to claim 25, wherein the first access mode corresponds to a read or write operation mode and the second access mode corresponds to a self-refresh operation mode.

30. The method according to claim 25, wherein the predetermined period comprises a period from a point at which execution of the second access mode was started to a point at which a predetermined word line in the semiconductor memory device is enabled in the second access mode.

31. The method according to claim 30, further comprising the step of setting in the second access mode, a word line address for executing a next second access mode after the predetermined word line is enabled.

32. The method according to claim 25, wherein the predetermined period comprises a period from a point at which the second access mode was executed to a point at which a word-line enable signal is generated for enabling a predetermined word line in the semiconductor memory device in the second access mode.

33. The method according to claim 25, wherein the first access mode corresponds to an external access operation and the second access mode corresponds to an internal access operation 34. A semiconductor device comprising:
   a plurality of word lines;
   an arbiter configured to receive a first entry signal for entering a first access mode and a second entry signal for entering a second access mode, to determine priority of the first and second access modes, and to generate a first mode trigger signal corresponding to a first entry mode and a second mode trigger signal corresponding to a second entry mode; and
   a signal generating circuit configured to generate an internal operation signal in accordance with at least one of the first mode trigger signal and the second mode trigger signal,
   wherein the arbiter interrupts the second access mode and gives priority to the first access mode when the arbiter receives the first entry signal before a predetermined word line of the plurality of word lines is enabled in the second access mode and after priority for the second access mode has been determined.

35. A semiconductor device comprising:
   an arbiter configured to receive a first entry signal for entering a first access mode and a second entry signal for entering a second access mode, to determine priority of the first and second access modes, and to generate a first mode trigger signal corresponding to a first entry mode and a second mode trigger signal corresponding to a second entry mode; and
   a signal generating circuit configured to generate an internal operation signal in accordance with at least one of the first mode trigger signal and the second mode trigger signal,
   an address generating circuit configured to generate an address to be used in the second access mode,
   wherein the arbiter gives priority to the first access mode when the arbiter receives the first entry signal before the address generating circuit generates the address to be used in the second access mode and after priority for the second access mode has been determined.

36. The semiconductor device according to claim 32, further comprising a command detector circuit that receives an external command and generates the first entry signal.

37. The semiconductor device according to claim 32, further comprising an internal circuit that generates the second entry signal.

38. The semiconductor device according to claim 32, wherein the first access mode corresponds to an external access operation and the second access mode corresponds to an internal access operation.

* * * * *